United States Patent
Tohlen et al.

(10) Patent No.: US 10,938,414 B1
(45) Date of Patent: Mar. 2, 2021

(54) ELECTRONIC DEVICE AND METHOD FOR COMPRESSING SAMPLED DATA

(71) Applicant: HONEYWELL FEDERAL MANUFACTURING & TECHNOLOGIES, LLC, Kansas City, MO (US)

(72) Inventors: Michael Aaron Tohlen, Lees Summit, MO (US); Mitchell Hedges Morrow, Overland Park, KS (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 0 days.

(21) Appl. No.: 16/860,177

(22) Filed: Apr. 28, 2020

Related U.S. Application Data

(63) Continuation-in-part of application No. 16/554,757, filed on Aug. 29, 2019, now abandoned, which is a continuation of application No. 16/150,355, filed on Oct. 3, 2018, now Pat. No. 10,447,297.

(51) Int. Cl.
*H03M 7/30* (2006.01)
*G06F 3/06* (2006.01)

(52) U.S. Cl.
CPC ........ *H03M 7/6058* (2013.01); *G06F 3/0608* (2013.01); *G06F 3/0661* (2013.01); *G06F 3/0673* (2013.01)

(58) Field of Classification Search
CPC .. H03M 7/6058; G06F 3/0608; G06F 3/0673; G06F 3/0661
USPC .......................................................... 341/87
See application file for complete search history.

(56) References Cited

U.S. PATENT DOCUMENTS

| | | | |
|---|---|---|---|
| 6,791,482 B2 * | 9/2004 | Koyanagi | H03M 1/661 341/61 |
| 7,477,999 B2 * | 1/2009 | Wegener | G01R 13/029 702/66 |
| 2012/0239627 A1 * | 9/2012 | Nyuunoya | H03M 7/3064 707/679 |

* cited by examiner

*Primary Examiner* — Khai M Nguyen
(74) *Attorney, Agent, or Firm* — Hovey Williams LLP

(57) ABSTRACT

An electronic device for compressing sampled data comprises a memory element and a processing element. The memory element is configured to store sampled data points and sampled times. The processing element is in electronic communication with the memory element and is configured to receive a plurality of sampled data points, a slope for each sampled data point in succession, the slope being a value of a change between the sampled data point and its successive sampled data point, and store the sampled data point in the memory element when the slope changes in value from a previous sampled data point.

20 Claims, 15 Drawing Sheets

INPUTAMPLITUDE

| 0 | S0 |
|---|---|
| 1 | S1 |
| 2 | S2 |
| ⋮ | ⋮ |
| n-1 | Sn-1 |

INPUTTIME

| 0 | t0 |
|---|---|
| 1 | t1 |
| 2 | t2 |
| ⋮ | ⋮ |
| n-1 | tn-1 |

FIG. 5

DIFFERENCE

| 0 | \| S1 - S0 \| |
|---|---|
| 1 | \| S2 - S1 \| |
| 2 | \| S3 - S2 \| |
| ⋮ | ⋮ |
| n-2 | \| Sn-1 - Sn-2 \| |

FIG. 6

OUTPUTAMPLITUDE

| 0 | S0 |
|---|---|
| 1 | S1 |
| 2 | S4 |
| ⋮ | ⋮ |
| n-1 | S20 |

OUTPUTTIME

| 0 | t0 |
|---|---|
| 1 | t1 |
| 2 | t4 |
| ⋮ | ⋮ |
| n-1 | t20 |

FIG. 7

ELECTRONIC DEVICE AND METHOD FOR COMPRESSING SAMPLED DATA

RELATED APPLICATION

The current patent application is a continuation in part patent application which claims priority benefit, with regard to all common subject matter, to U.S. patent application Ser. No. 16/554,757, entitled "ELECTRONIC DEVICE AND METHOD FOR COMPRESSING SAMPLED DATA", and filed Aug. 29, 2019, which is a continuation patent application that claims priority benefit, with regard to all common subject matter, to U.S. patent application Ser. No. 16/150,355, now U.S. Pat. No. 10,447,297, entitled "ELECTRONIC DEVICE AND METHOD FOR COMPRESSING SAMPLED DATA", and filed Oct. 3, 2018. The listed earlier-filed patent applications are hereby incorporated by reference, in their entireties, into the current patent application.

STATEMENT REGARDING FEDERALLY-SPONSORED RESEARCH OR DEVELOPMENT

This invention was made with Government support under Contract No.: DE-NA00002839 awarded by the United States Department of Energy/National Nuclear Security Administration. The Government has certain rights in the invention.

BACKGROUND OF THE INVENTION

Field of the Invention

Embodiments of the current invention relate to electronic devices and methods for compressing sampled data.

Description of the Related Art

Capturing and recording a value of a signal or waveform at regular time intervals, a process known as "sampling", often results in large amounts of sampled data. Sampled data may be captured from, or come in the form of, audio signals, video signals, sensor data, and the like. Typically, it is desirable to compress, or reduce, the sampled data before storing or transmitting it so that the sampled data takes up less storage space, requires less communication bandwidth to transmit, or results in a shorter transmission time. Data compression techniques, such as aperture sampling, may reduce the sampled data by capturing significant changes in a signal or waveform's point-to-point amplitude. However, these techniques might not provide sufficient compression of the ever-increasing amount of media content generated by ubiquitous electronic devices and other sources. The result is a greater than necessary amount of storage space being consumed and increased requirements of bandwidth and transmission time.

SUMMARY OF THE INVENTION

Embodiments of the current invention solve the above-mentioned problems and provide a distinct advance in the art of compressing sampled data. In one embodiment, the current invention provides an electronic device configured to analyze a plurality of slopes, or first derivative, of the signal or waveform—resulting in an increase of the compression of sampled data. The electronic device broadly comprises a memory element and a processing element. The memory element is configured to store sampled data points and sampled times. The processing element is in electronic communication with the memory element and is configured to receive a plurality of sampled data points, a slope for each sampled data point in succession, the slope being a value of a change between the sampled data point and its successive sampled data point, and store the sampled data point in the memory element when the slope changes in value from a previous sampled data point.

In another embodiment, the current invention provides a electronic device for compressing sampled data. The electronic device broadly comprises a memory element and a processing element. The memory element is configured to store sampled data points and sampled times. The processing element is in electronic communication with the memory element and is configured to receive a plurality of sampled data points and a plurality of sampled times, each sampled data point associated with a successive one of the sampled times, calculate a plurality of differences, each difference being a magnitude of a change between successive adjacent pairs of sampled data points, calculate a plurality of difference changes, each difference change being a magnitude of a change between successive adjacent pairs of differences, compare each difference change to a threshold, and for each difference change that is greater than the threshold, store in the memory element one sampled data point associated with the difference change.

In yet another embodiment, the current invention provides a computer-implemented method for compressing sampled data. The method comprises receiving a plurality of sampled data points and a plurality of sampled times, each sampled data point associated with a successive one of the sampled times; calculating a plurality of differences, each difference being a magnitude of a change between successive adjacent pairs of sampled data points; calculating a plurality of difference changes, each difference change being a magnitude of a change between successive adjacent pairs of differences; comparing each difference change to a threshold; and for each difference change that is greater than the threshold, storing in the memory element one sampled data point associated with the difference change.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the current invention will be apparent from the following detailed description of the embodiments and the accompanying drawing figures.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the current invention will be apparent from the following detailed description of the embodiments and the accompanying drawing figures.

BRIEF DESCRIPTION OF THE DRAWING FIGURES

Embodiments of the current invention are described in detail below with reference to the attached drawing figures, wherein.

Figure 2:
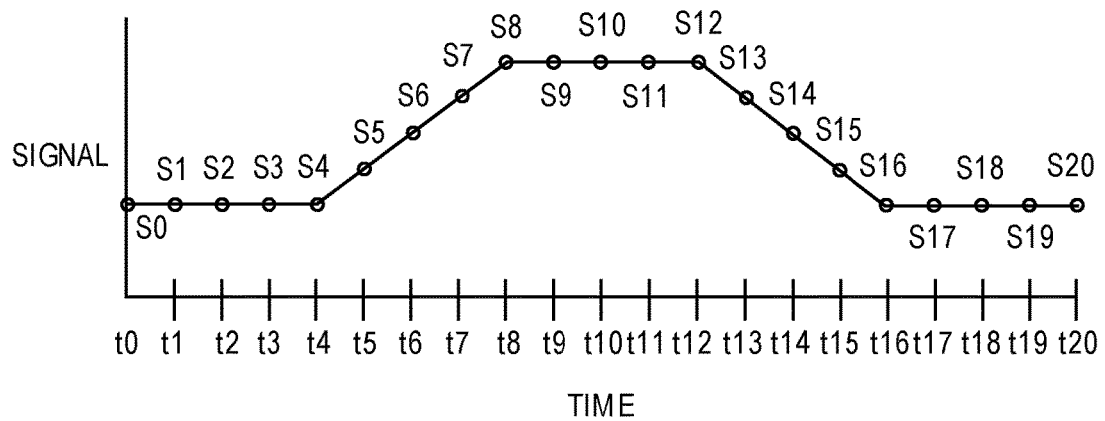
FIG. 2 is a plot of a signal vs. time, the plot including a plurality of sampled data points and sampled times.
Figure 4A:
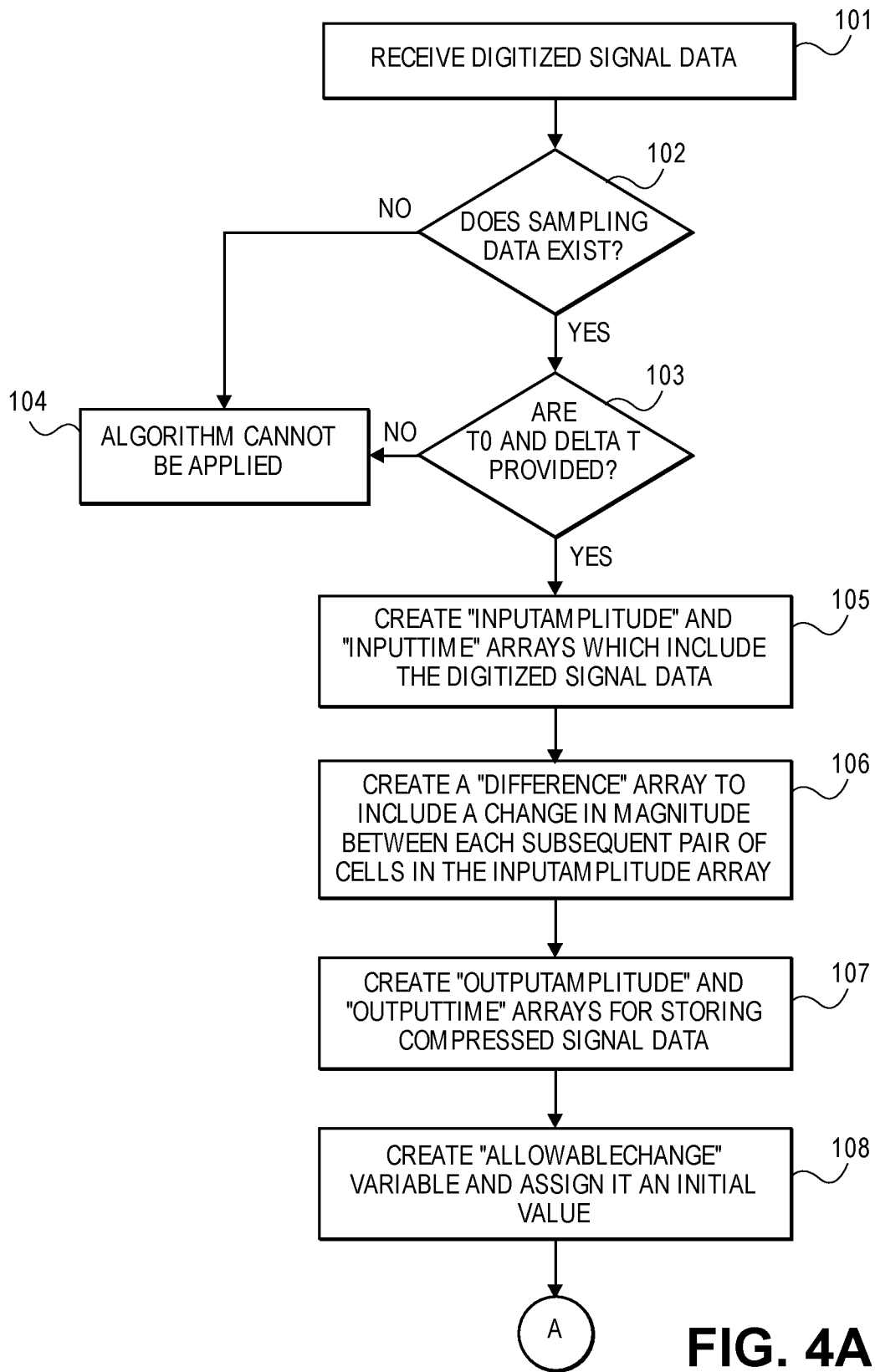
Figure 4B:
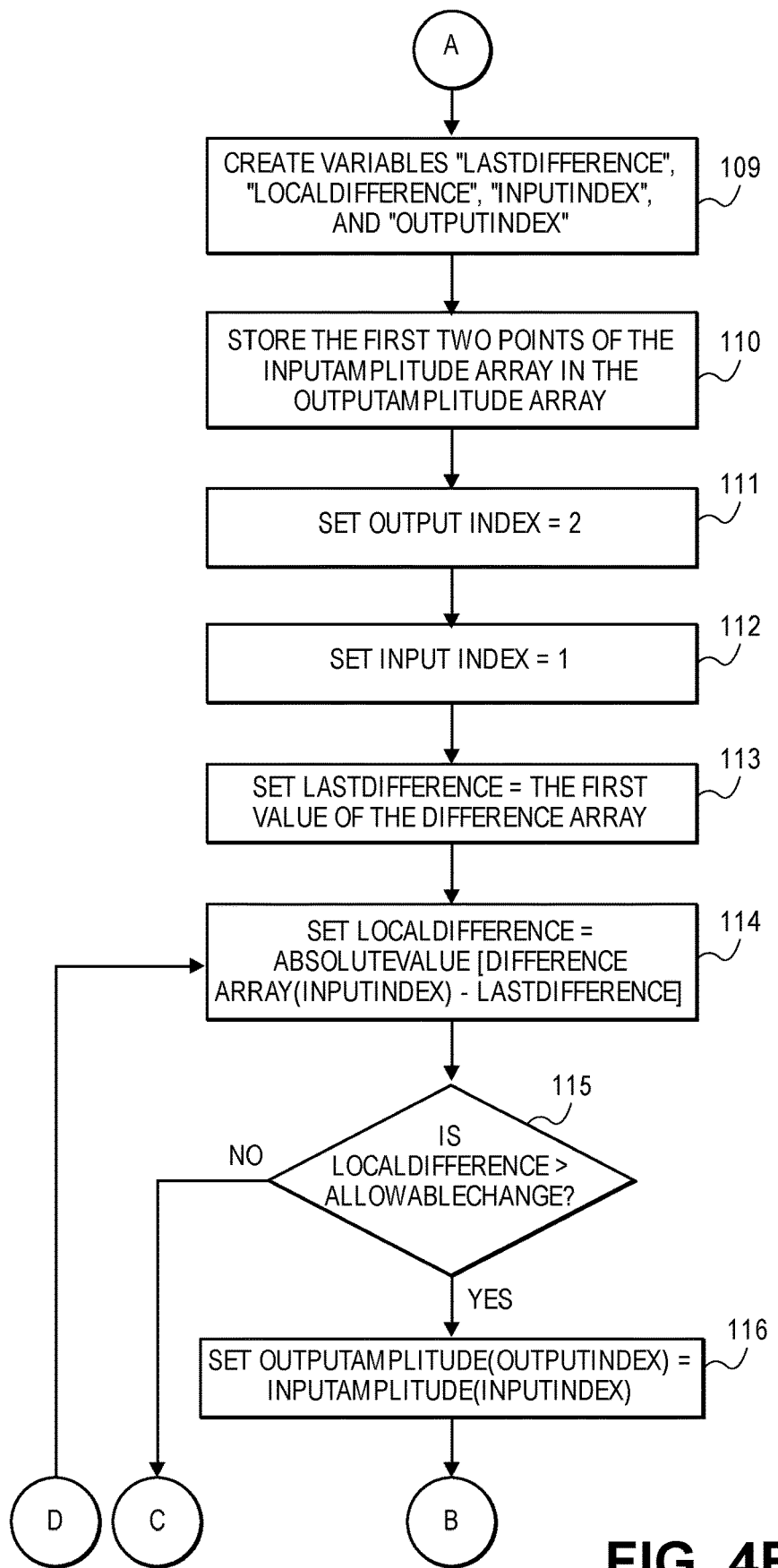
Figure 4C:
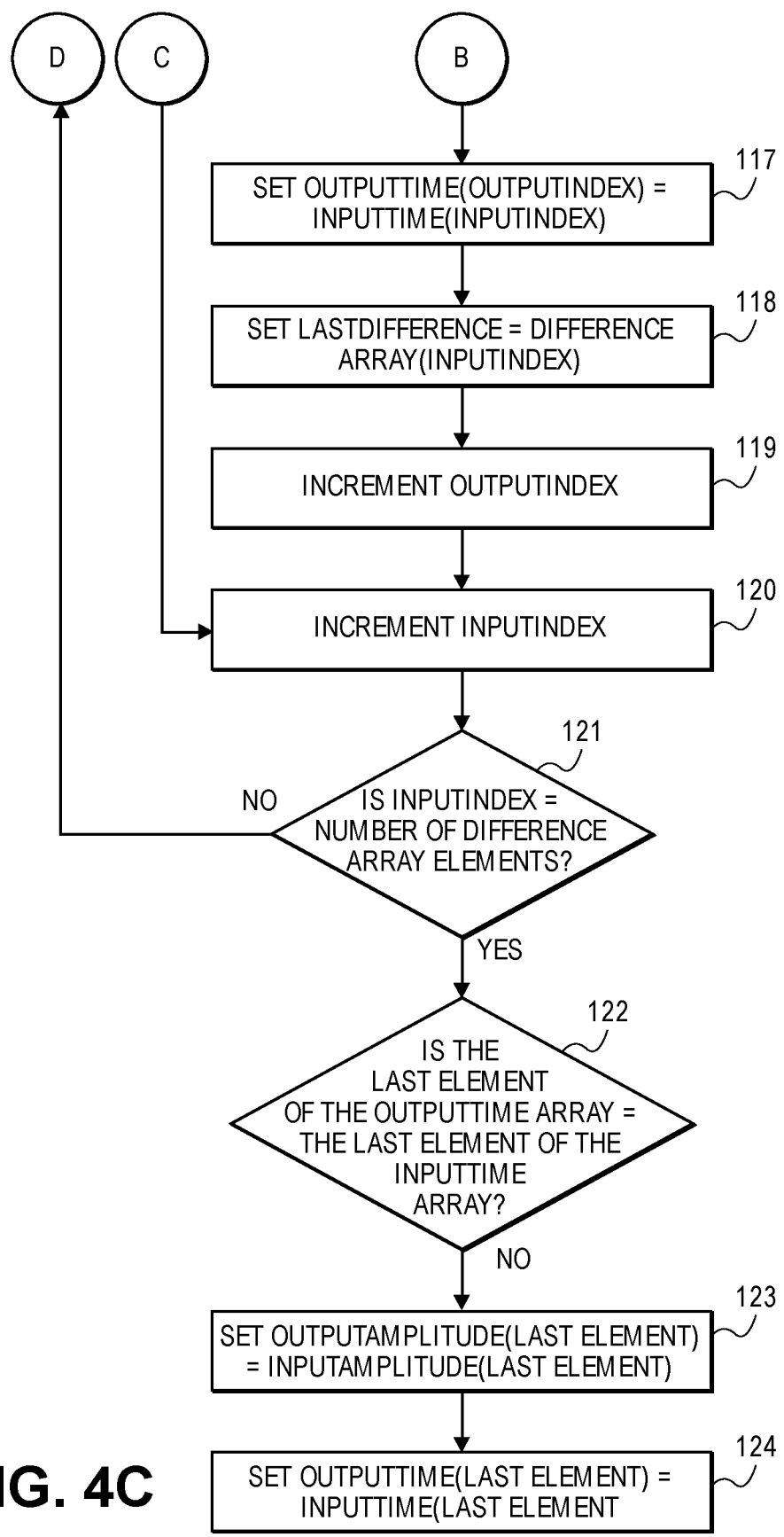
Figure 8:
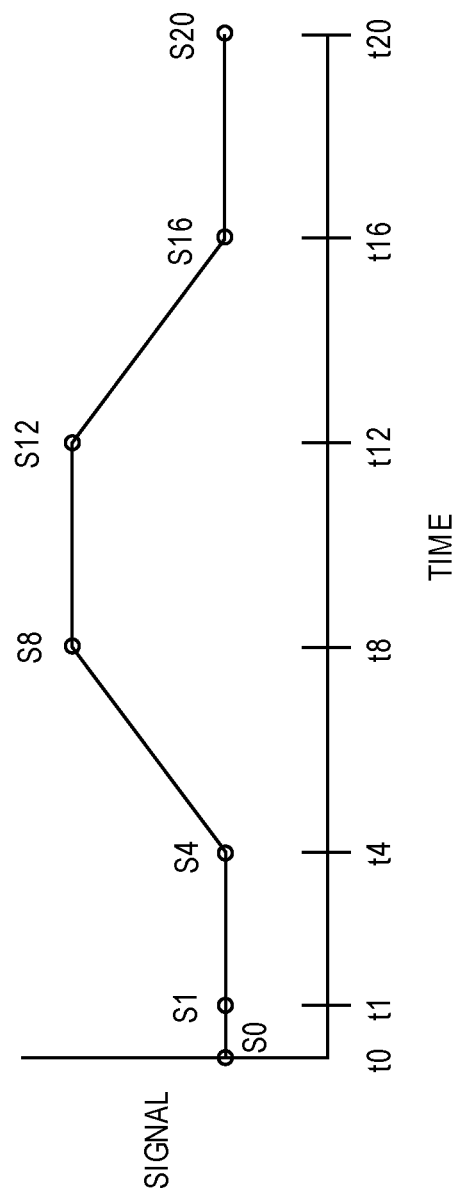
Figure 9:
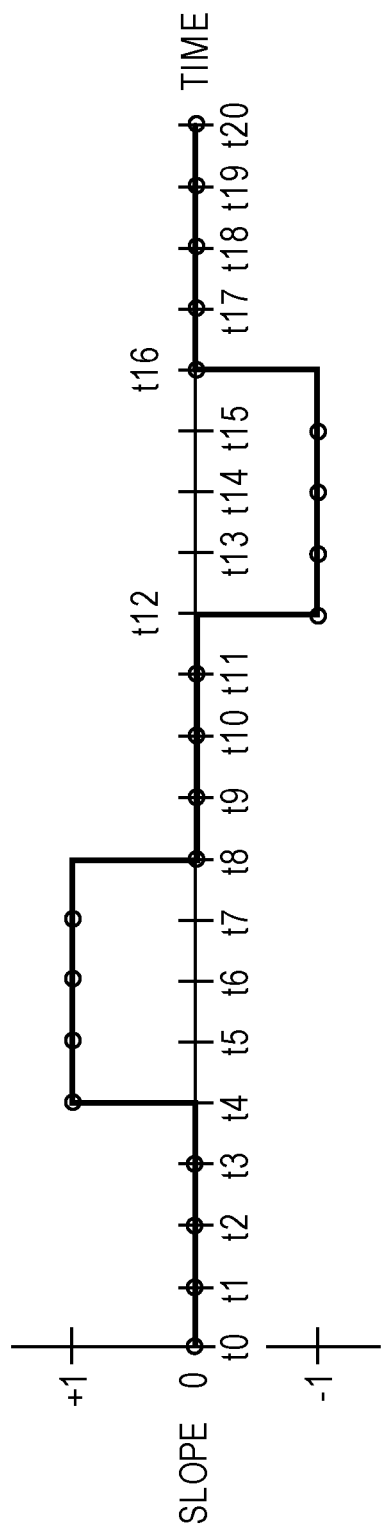
Figure 10:
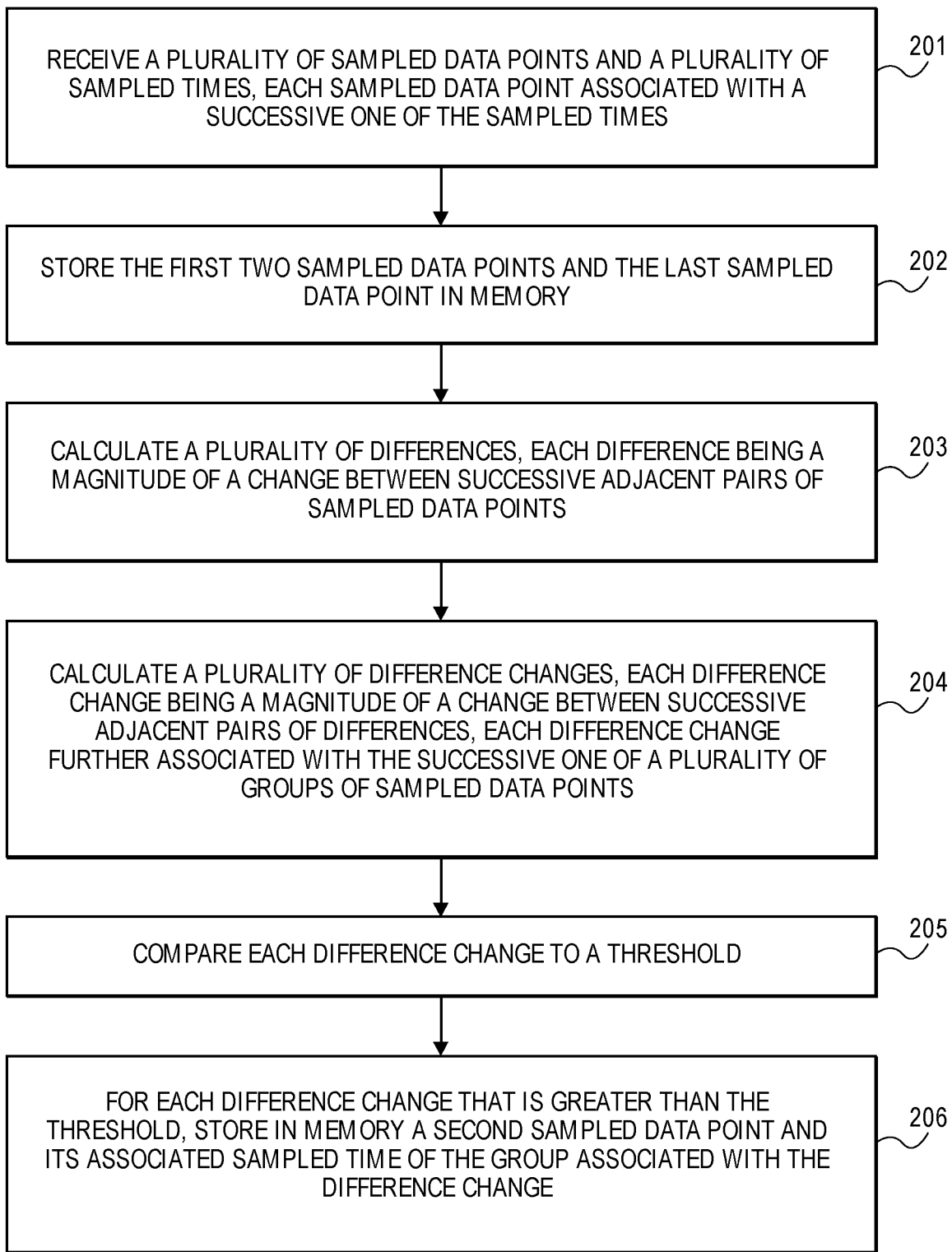
Figure 11A:
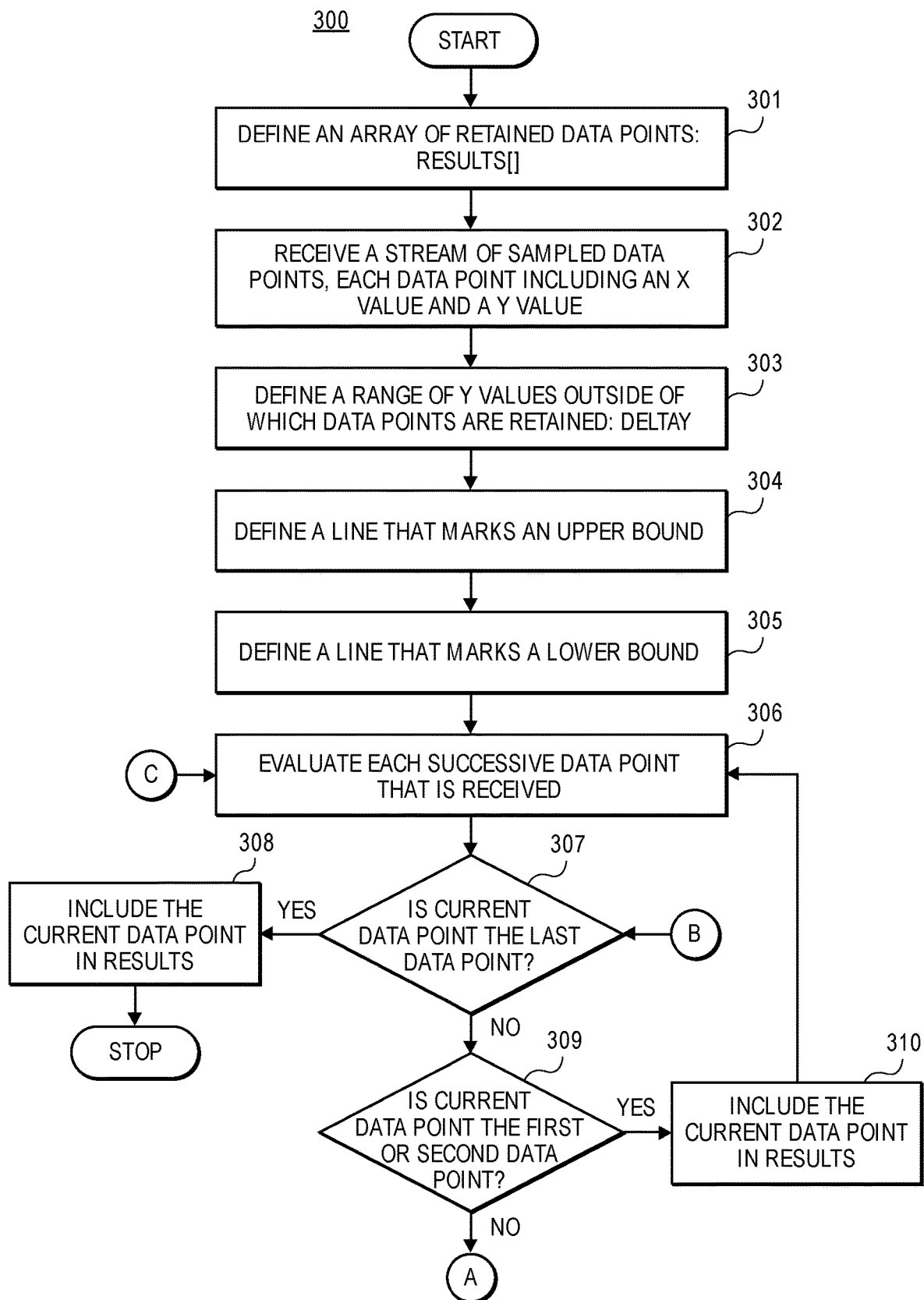
Figure 11B:
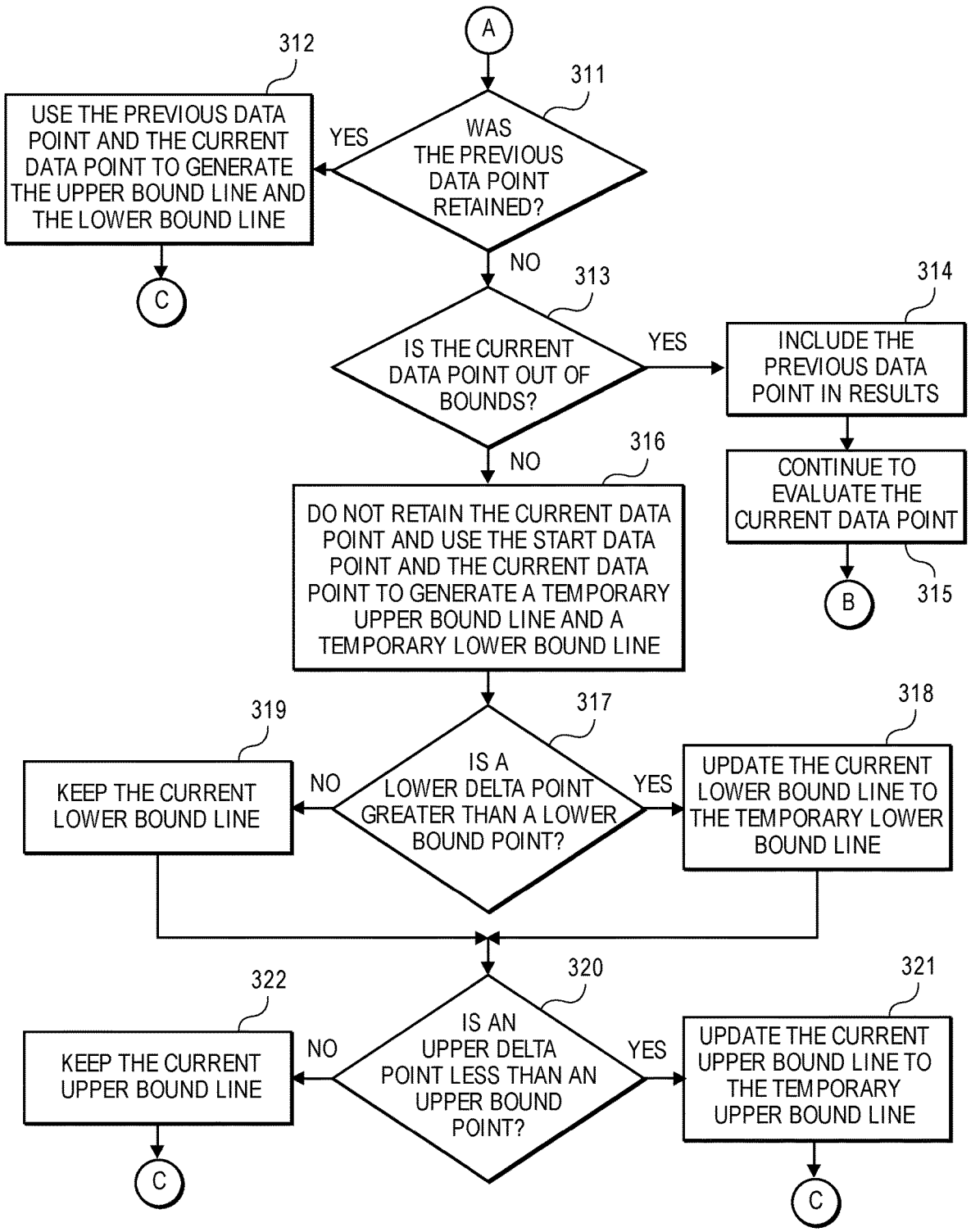
Figure 12:
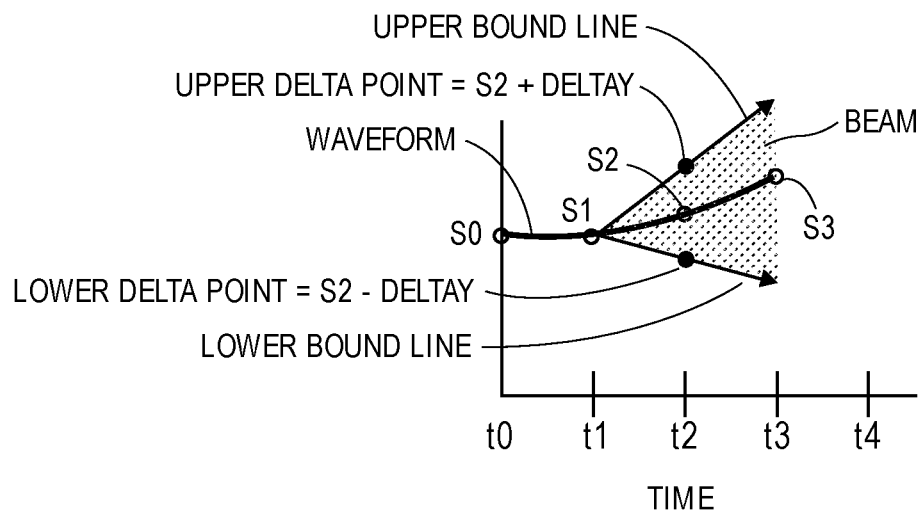
Figure 13:
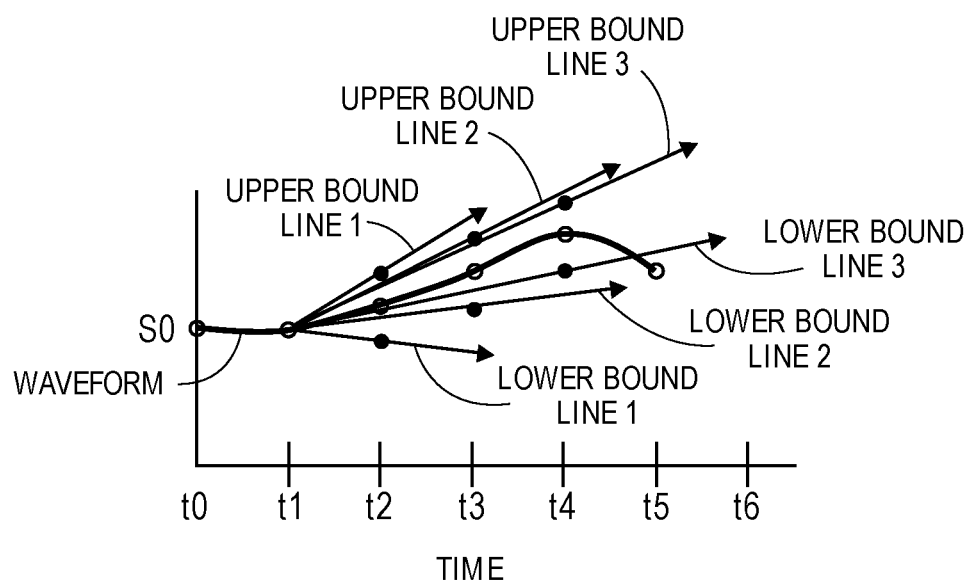
Figure 14:
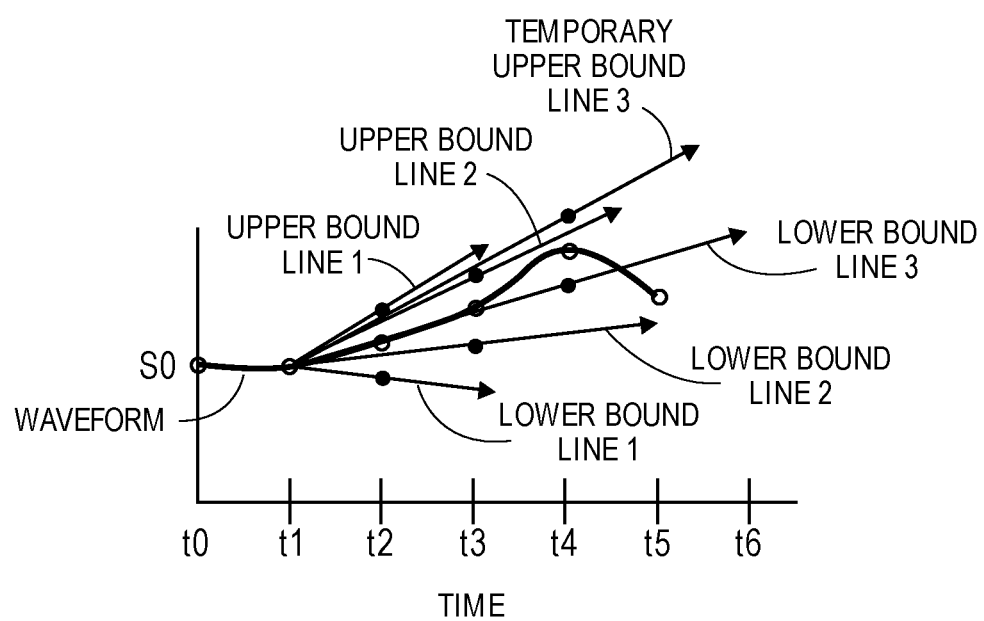
Figure 15:
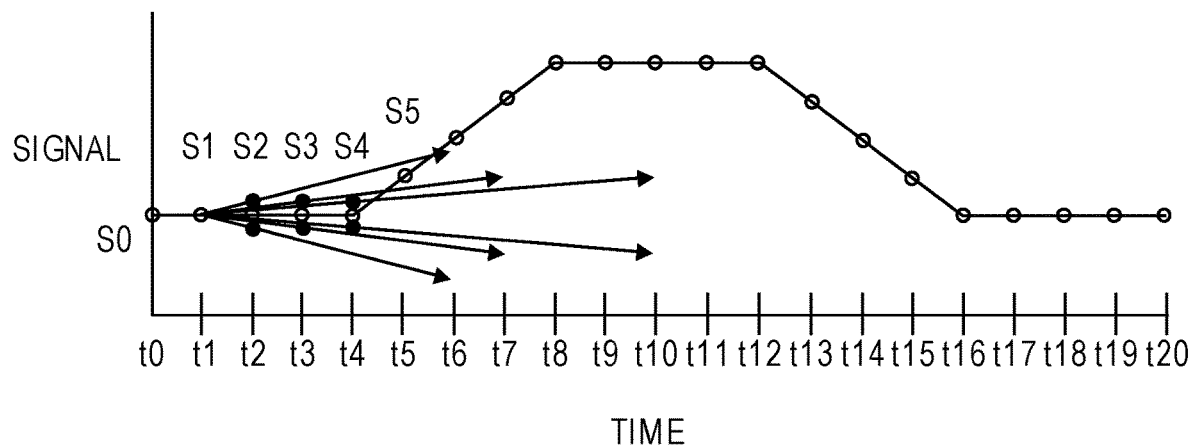
Figure 16:
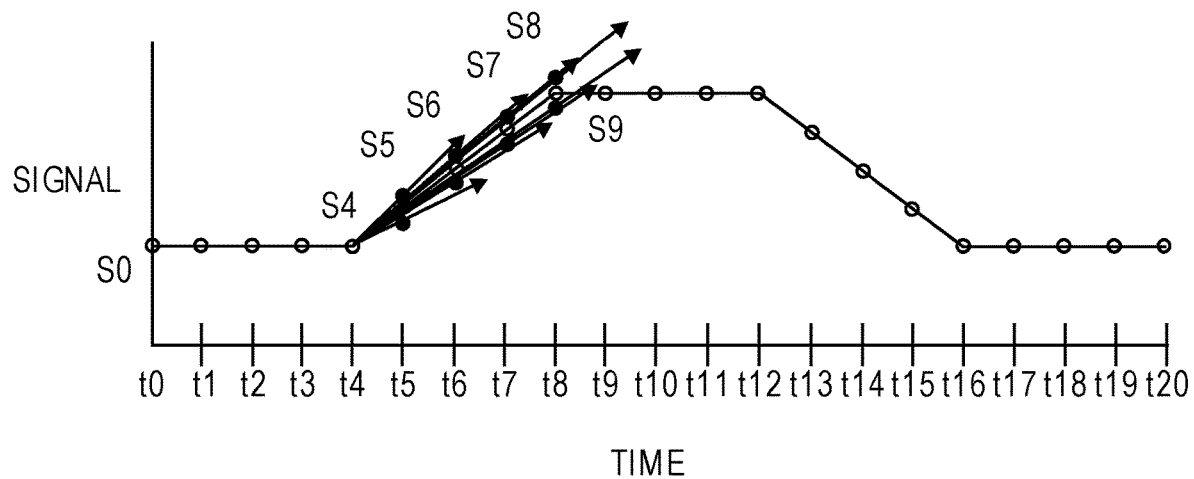
Figure 17:
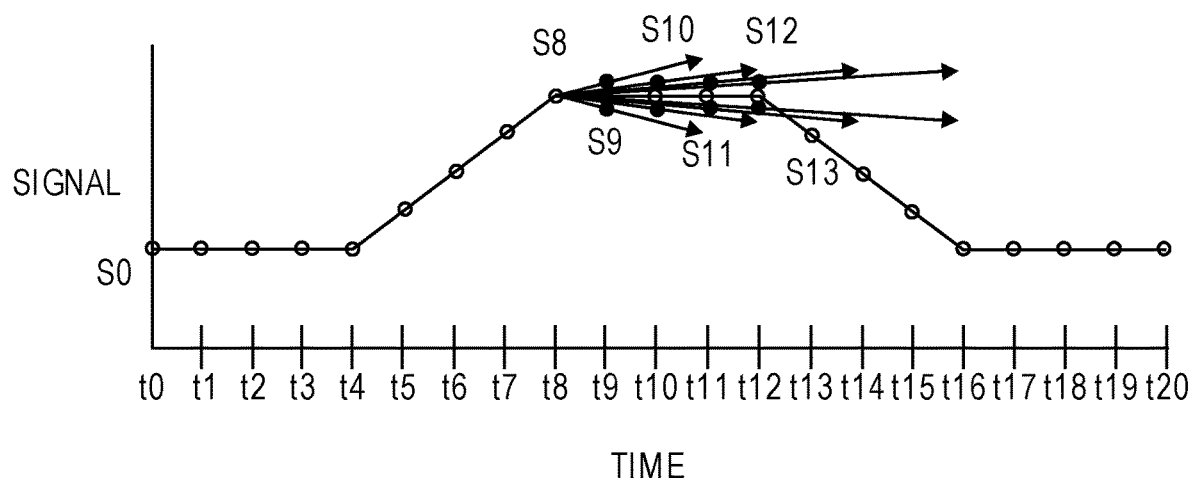
Figure 18:
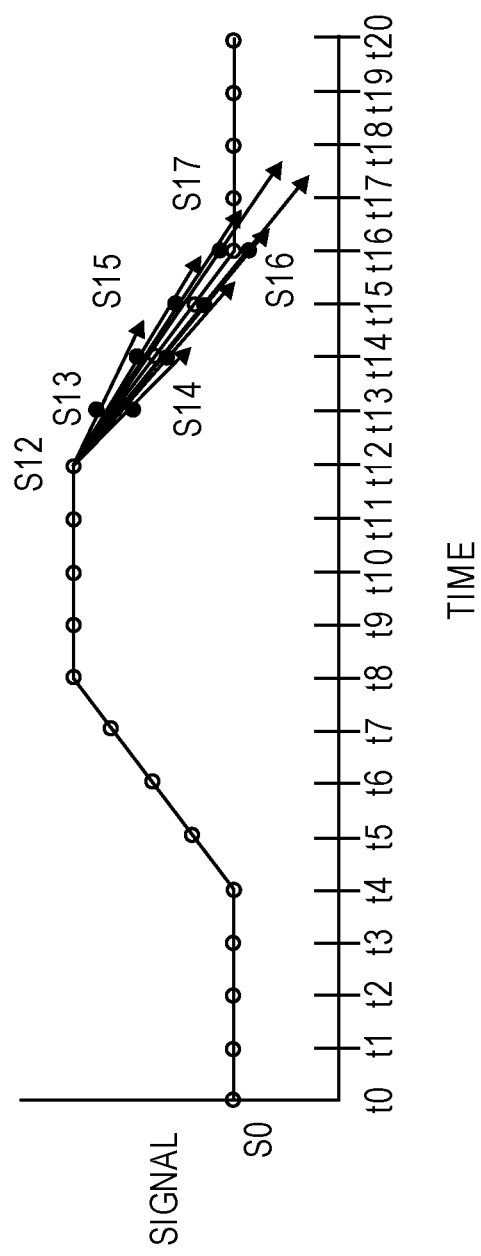
Figure 19:
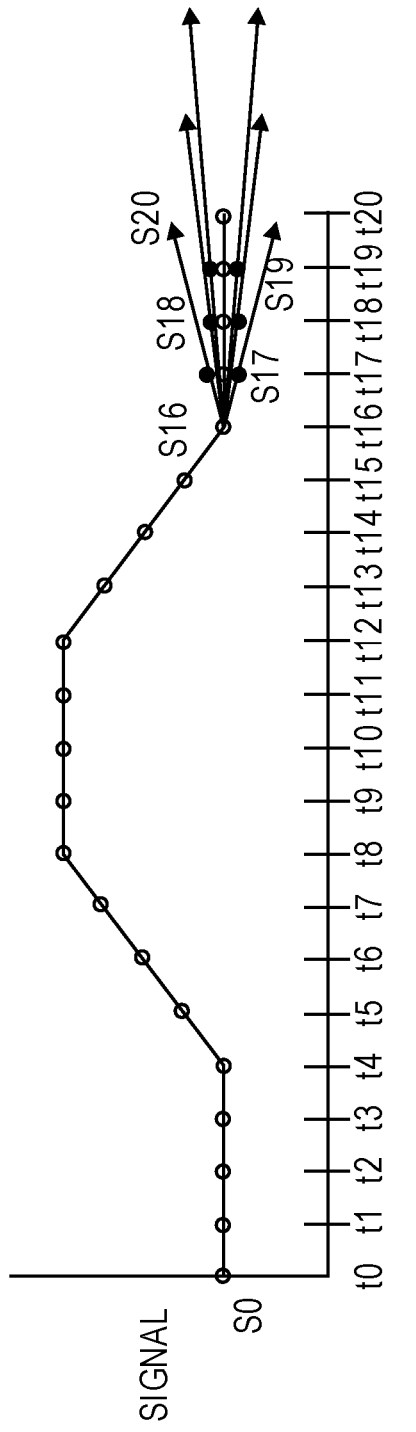
Figure 20A:
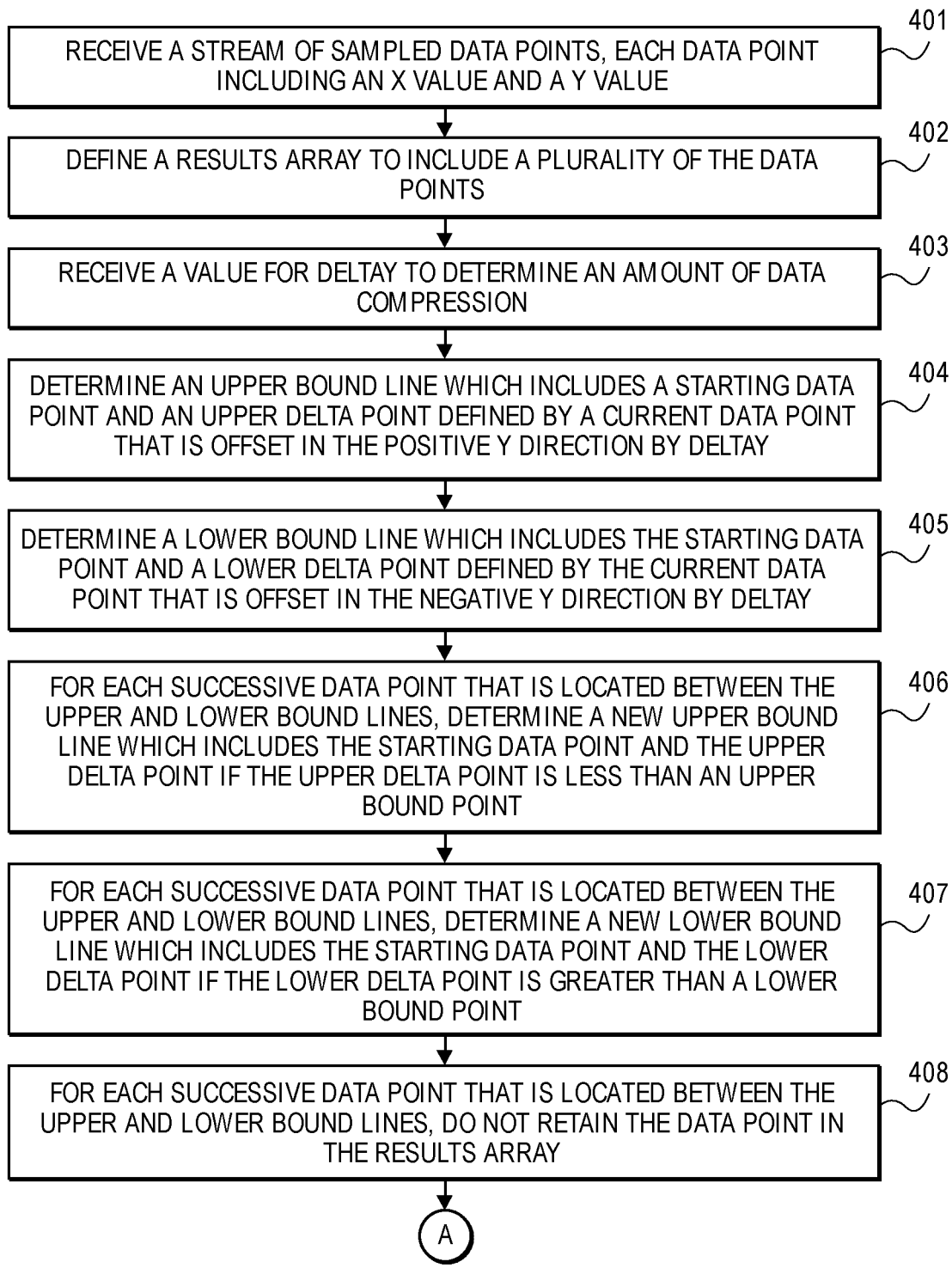
Figure 20B:
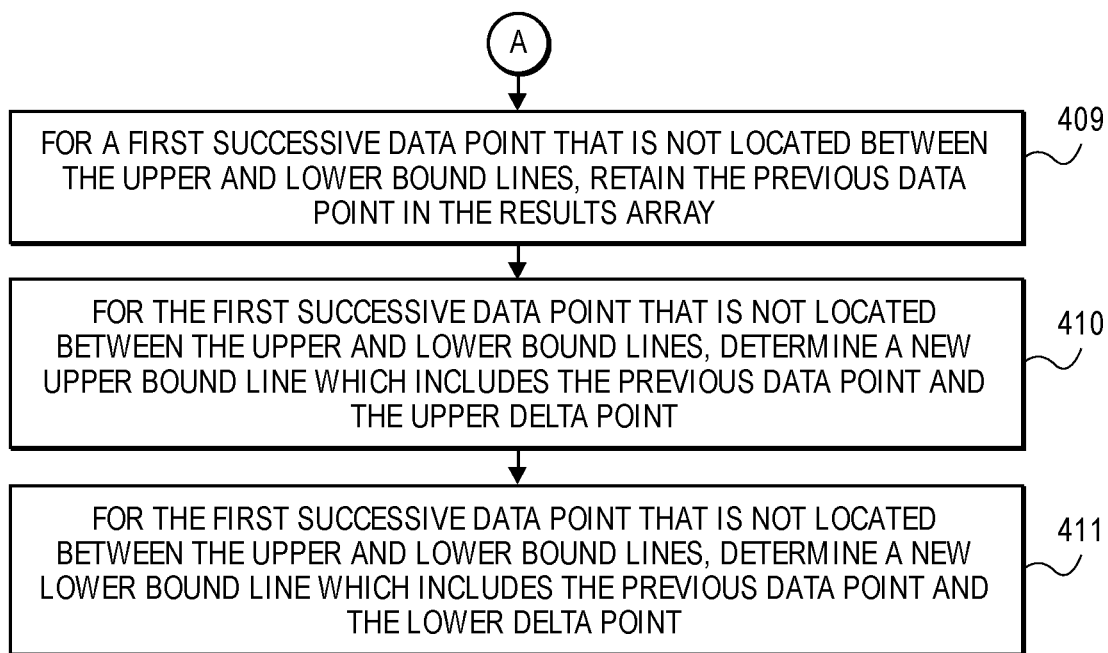

FIGS. 4A, 4B, and 4C depict a flow chart of an algorithm for compressing sampled data;

FIG. 5 is a depiction of an inputamplitude array, configured to store sampled data points, and an inputtime array, configured to store sampled times;

FIG. 6 is a depiction of a difference array, configured to store a plurality of differences, each difference being a magnitude of a change between successive adjacent pairs of sampled data points;

FIG. 7 is a depiction of an outputamplitude array, configured to store compressed data points, and an outputtime array, configured to store compressed times;

FIG. 8 is a plot of the signal vs. time of FIG. 2, depicting only the compressed data points and compressed times;

FIG. 9 is a plot of the slope vs. time for the waveform of FIG. 2;

FIG. 10 is a listing of at least a portion of the steps of a method for compressing sampled data;

FIGS. 11A and 11B is depict a flow chart of a second algorithm for compressing data that has been sampled from an analog waveform;

FIG. 12 is a plot of a first waveform over time illustrating portions of the second algorithm;

FIG. 13 is a plot of a second waveform over time illustrating portions of the second algorithm;

FIG. 14 is a plot of a third waveform over time illustrating portions of the second algorithm;

FIG. 15 is a plot of the signal vs. time for the waveform of FIG. 2 illustrating the application of the second algorithm on a first portion of the waveform;

FIG. 16 is a plot of the signal vs. time for the waveform of FIG. 2 illustrating the application of the second algorithm on a second portion of the waveform;

FIG. 17 is a plot of the signal vs. time for the waveform of FIG. 2 illustrating the application of the second algorithm on a third portion of the waveform;

FIG. 18 is a plot of the signal vs. time for the waveform of FIG. 2 illustrating the application of the second algorithm on a fourth portion of the waveform;

FIG. 19 is a plot of the signal vs. time for the waveform of FIG. 2 illustrating the application of the second algorithm on a fifth portion of the waveform; and FIGS. 20A and 20B include a listing of at least a portion of the steps of a second method for compressing data that has been sampled from an analog waveform.

The drawing figures do not limit the current invention to the specific embodiments disclosed and described herein. The drawings are not necessarily to scale, emphasis instead being placed upon clearly illustrating the principles of the invention.

DETAILED DESCRIPTION OF THE EMBODIMENTS

The following detailed description of the technology references the accompanying drawings that illustrate specific embodiments in which the technology can be practiced. The embodiments are intended to describe aspects of the technology in sufficient detail to enable those skilled in the art to practice the technology. Other embodiments can be utilized and changes can be made without departing from the scope of the current invention. The following detailed description is, therefore, not to be taken in a limiting sense. The scope of the current invention is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the current technology can include a variety of combinations and/or integrations of the embodiments described herein.

Figure 1:
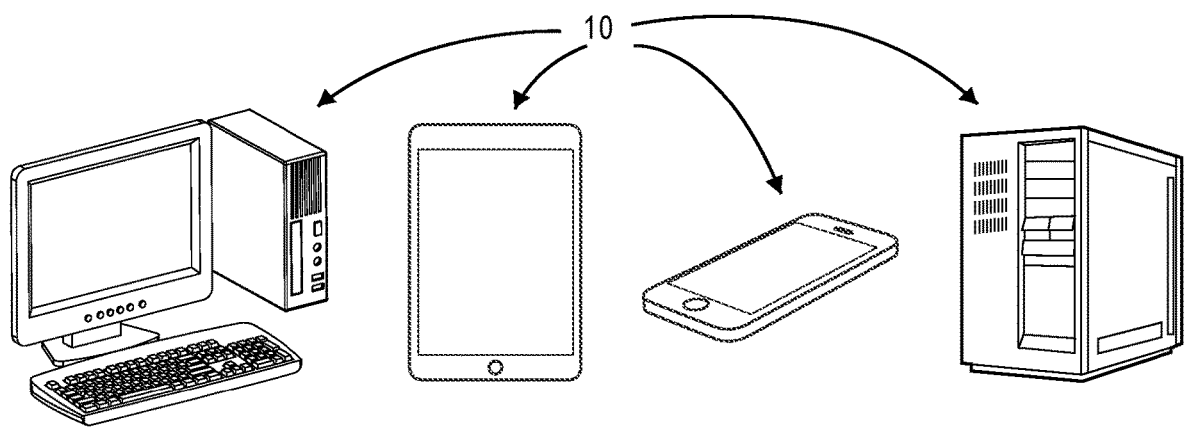
FIG. 1 is a perspective view of a plurality of electronic devices, each constructed in accordance with various embodiments of the current invention, each configured to perform compression of sampled data.

An electronic device 10 for compressing sampled data is shown constructed in accordance with various embodiments of the current invention in FIG. 1. In some instances, the electronic device 10 may be embodied by server computers, workstation computers, desktop computers, or the like which are able to receive a file of sampled data and perform compression thereon. In other instances, the electronic device 10 may be embodied by laptop computers, palmtop computers, notebook computers, tablets or tablet computers, smart phones, mobile phones, cellular phones, personal digital assistants (PDAs), smart watches or wearables, or the like which include components, such as cameras, microphones, sensors, and so forth, that are able to stream sampled data or generate a file of sampled data on which the device 10 can perform compression.

Sampling data may be illustrated in the plot of a signal, or waveform, versus time, as shown in FIG. 2. The signal may be the output of a camera, a microphone, a sensor, or the like and may represent moving or still image data, audio data, motion data, and so forth. Sampling the signal may involve capturing and recording a value of an amplitude of the signal at an instant in time, which creates a sample. The capturing and recording may occur repeatedly, typically at a constant frequency, known as the sampling rate or sampling frequency—thus, generating sampled data. In the example of FIG. 2, the samples, or sampled data points, are shown as a plurality of points, or dots, along the signal and are labeled $S_n$, where n is an index number ranging from 0 to 20. This range is merely exemplary. In practical situations, the range of samples may be orders of magnitude greater. Each sample is taken at a time point, labeled $t_n$, where n is the same index as is used for the samples. The sampled data may form an array with n elements having values $S_0$ to $S_{n-1}$.

Compressing the sampled data, in general, produces an output array of data, compressed data, that includes fewer elements than the array of sampled data. The compressed data (and the compression process) may be lossless, which means that the original signal, from which the sampled data was taken, can be reconstructed perfectly using linear interpolation. Alternatively, the compressed data (and the compression process) may be lossy, which means that the original signal cannot be reconstructed perfectly because some of the sampled data was lost or purposely discarded in an attempt to achieve further compression.

Figure 3:
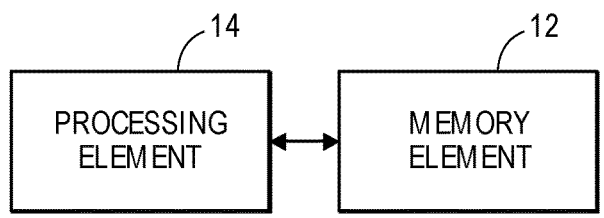
FIG. 3 is a schematic block diagram of various components of one electronic device.

The electronic device 10 may broadly comprise a memory element 12 and a processing element 14, as shown in FIG. 3. The electronic device 10 may further include components such as a display, a user interface including inputs such as a keyboard, a mouse, a touchscreen, or a microphone and outputs such as a speaker, a communication element allowing communication with other devices or systems, cameras, sensors, and the like which will not be discussed in detail.

The memory element 12 may be embodied by devices or components that store data in general, and digital or binary data in particular, and may include exemplary electronic hardware data storage devices or components such as read-only memory (ROM), programmable ROM, erasable programmable ROM, random-access memory (RAM) such as static RAM (SRAM) or dynamic RAM (DRAM), cache memory, hard disks, floppy disks, optical disks, flash memory, thumb drives, universal serial bus (USB) drives, or the like, or combinations thereof. In some embodiments, the memory element 12 may be embedded in, or packaged in the same package as, the processing element 14. The memory element 12 may include, or may constitute, a non-transitory "computer-readable storage medium". The memory element 12 may store the instructions, code, code statements, code segments, software, firmware, programs, applications, apps, services, daemons, or the like that are executed by the processing element 14. The memory element 12 may also store settings, data, documents, sound files, photographs, movies, images, databases, and the like. In various embodiments, the memory element 12 may receive and store sampled data.

The processing element 14 may include electronic hardware components such as processors, microprocessors (single-core or multi-core), microcontrollers, digital signal processors (DSPs), field-programmable gate arrays (FPGAs), analog and/or digital application-specific integrated circuits (ASICs), or the like, or combinations thereof. The processing element 14 may generally execute, process, or run instructions, code, code segments, code statements, software, firmware, programs, applications, apps, processes, services, daemons, or the like. The processing element 14 may also include hardware components such as finite-state machines, sequential and combinational logic, and other electronic circuits that can perform the functions necessary for the operation of the current invention. The processing element 14 may be in communication with the other electronic components through serial or parallel links that include universal busses, address busses, data busses, control lines, and the like.

The processing element 14 may be configured or programmed to perform the following functions or operations as a result of hardware, software, firmware, or combinations thereof. The processing element 14 may implement an algorithm 100 for compressing sampled data, as shown in the flowchart of FIGS. 4A, 4B, and 4C and explained as follows. Digitized signal data is received, as indicated in block 101. In some cases, the data may include just sampled values without any timing information, such as sampling rate or times, such as timestamps or time of day, when each sampled value was captured. In other cases, the digitized data may include sampled data values and timing data such as sampling rates or sampled data times. The digitized signal data is examined to determine the content of the data, as in decision blocks 102, 103. If the data does not include timing information, then the algorithm 100 cannot be applied, as indicated in block 104. Otherwise, if the data includes the proper information, then the data is separated into an "inputamplitude" array and an "inputtime" array, as indicated in block 105. The inputamplitude array includes values of all of the sampled data points, Sn, wherein each value is a real number representing an actual value of a physical quantity, such as electric voltage or electric current. There is one sampled data point per array element or cell, as shown in FIG. 5. The inputtime array includes all of the sampled times, tn, wherein the sampled time is a time value, such as a time of day timestamp or an offset time period from when the first sample was taken. There is one sampled time per array element or cell, as shown in FIG. 5.

As indicated in block 106, a "difference" array is created to include a change in magnitude between each subsequent pair of cells in the inputamplitude array (which are the sampled data points). The difference array may be notated as Dm or difference[m], wherein m ranges from 0 to the number of sampled data points minus one. As shown in FIG. 6, each cell of the difference array includes an absolute value of a (mathematical subtraction) difference between adjacent inputamplitude array cells. For example, within the first cell of the difference array, D0 or difference[0], is stored: |S1−S0|, which is also: |inputamplitude[1]−inputamplitude[0]|. Since the difference array includes the mathematical difference between adjacent inputamplitude array cells, the difference array will include one fewer cell than the inputamplitude array. In some embodiments, each cell of the difference array, difference[m], may be calculated as the absolute value of the difference between adjacent inputamplitude array cells divided by a difference between adjacent inputtime array cells. For example, the first cell of the difference array may be calculated as |(S1−S0)/(t1−t0)|.

Arrays "outputamplitude" and "outputtime" are created to store the compressed output data values for the amplitude and time, respectively, as indicated in block 107. The compressed output data values for the amplitude and time include the sampled data points and sampled data times, respectively, that are saved according to the rules of the algorithm 100, as discussed in more detail below.

An "allowablechange" variable is also created and assigned a value, as indicated in block 108. The allowablechange variable controls whether the algorithm 100 is lossless or lossy, and how much compression or loss occurs. For example, the data compression of the algorithm 100 is lossless when allowablechange=0. The data compression of the algorithm 100 is lossy when allowablechange>0. Generally, the greater the value of allowablechange, the more lossy the data compression. During implementation of the algorithm 100, the allowablechange variable acts as a constant and maintains its value throughout execution, but it may change value from the compression of one sampled data set to the next. In some embodiments, the user may be able to choose the value of the allowablechange variable in order to control the performance of the algorithm 100. Variables "lastdifference", "localdifference", "inputindex", and "outputindex" are created as indicated in block 109. lastdifference stores a value of the most recent cell from the difference array while the algorithm 100 sequentially retrieves the value of each cell of the difference array, as discussed in more detail below. localdifference stores a difference in magnitude between sequentially retrieved values of cells of the difference array and lastdifference. inputindex is a pointer that points to a current cell of the inputamplitude array. outputindex is pointer that points to a current cell of the outputamplitude array.

The values from the first two cells of the inputamplitude array are stored into the first two cells of the outputamplitude array, as indicated in block 110. This is a default step to store the first two sampled data points. outputindex is initialized to a value of 2 and inputindex is initialized to a value of 1, as indicated in blocks 111, 112. lastdifference is also initialized to have to the first value of the difference array, as indicated in block 113.

localdifference is set to be equal to an absolute value of a difference between the value of the difference array cell pointed to by inputindex and lastdifference, as indicated in block 114. The step of block 114 may mark the beginning of a loop of steps that are performed repeatedly. The number of times that the loop of steps may be performed is equal to the number of cells in the difference array minus 1.

The sampled data points may be considered to form a plurality of segments in sequential order, wherein each segment is a line between successive adjacent pairs of sampled data points. For example, a first segment may be a line between the first and second sampled data points, a second segment may be a line between the second and third sampled data points, and so forth. The slope of each segment may be a difference in its y-values divided by a difference in its x-values. Given that each segment has the same difference in its x-values, the slope then may be considered just the change in its y-values, which is the difference in sampled data points, or what is stored in each cell of the difference array. Since lastdifference stores the value of the most recent difference array cell, the step of block 114 calculates the magnitude of the change in slope from segment to segment, wherein the change is stored in localdifference. For example, the first time the step of block 114 is performed, inputindex=1 and lastdifference=D0. Thus, localdifference=|D1−D0|. In other words, the first time through, localdifference equals the magnitude of the change in slope from the first segment to the second segment.

localdifference is compared to allowablechange to determine if localdifference is greater than allowablechange, as indicated in decision block 115. The step of block 115 determines whether compression is performed, wherein compression is the discarding of the current sampled data point from being stored in the outputamplitude array, which is the compressed data set. The current sampled data point is the second point of the first segment, which is also the first point of the second segment in the comparison. If localdifference (the amount of change in the slope of the last two segments) is less than or equal to allowablechange, then compression is performed and the current sampled data point is not stored in the outputamplitude array. In other words, if the slope of the segments is not changing much at the current sampled data point, then there is no need to save the current sampled data point. And, the flow of the algorithm 100 is from block 115 to block 120.

On the other hand, if localdifference is greater than allowablechange, then compression is not performed and the current sampled data point is stored in the outputamplitude array. In other words, if the slope of the segments is changing significantly at the current sampled data point, then the current sampled data point should be saved. And, the algorithm 100 flows to block 116, in which the current sampled data point, inputamplitude[inputindex], is saved in the compressed data set, outputamplitude[outputindex]. To continue the example above regarding the first time the steps of blocks 115 and 116 are performed, localdifference, which is |D1−D0|, is compared with allowablechange. This comparison involves the sampled data points S0, S1, S2, and determines whether the slope of the segments formed by the points changes significantly at S1. If so, sampled data point S1 is saved. If not, then sampled data point S1 is not saved.

In addition, the current sampled time point, inputtime[inputindex], is saved in the compressed time set, outputtime[outputindex], as indicated in block 117. Furthermore, lastdifference is updated with the current value from the difference array, difference[inputindex], as indicated in block 118. outputindex is incremented, as indicated in block 119, since a sampled data point was saved in the compressed data set.

inputindex is incremented, as indicated in block 120. This step is performed either after the step of block 119 or after the step of block 115 if localdifference is not greater than allowablechange. Thus, inputindex is incremented whether or not compression was performed on the current sampled data point.

inputindex is checked to determine if it is equal to the number of difference array elements, as indicated in decision block 121. If not, then the loop of steps from blocks 114-120 continues, and the flow of the algorithm 100 returns to the step of block 114. If so, then the loop of steps from blocks 114-120 is complete, and the flow proceeds to the step of decision block 122, wherein the last element of the outputtime array is checked to determine if it is equal to the last element of the inputtime array. If so, then the algorithm 100 is complete. If not, then the last sampled data point, inputamplitude[last element], is stored in the compressed data set, outputamplitude[last element], as indicated in block 123. And, the last sampled time point, inputtime[last element], is stored in the compressed time set, outputtime[last element], as indicated in block 124. After the step of block 124, the algorithm 100 is complete.

As an example of its operation, the algorithm 100 was applied to a sampled data set created by sampling the signal shown in FIG. 2. The compressed data set and the compressed time set, which are the outputamplitude array and the outputtime array, respectively, are shown in FIG. 7. And, the compressed data points plotted on the original signal are shown in FIG. 8. As can be seen in FIG. 8, the first two sampled data points, S0, S1, were saved, as indicated in the step of block 110. The other sampled data points, S4, S8, S12, and S16, that were saved as compressed data were the data points at which the slope of the segments changed significantly, i.e., the slope change was greater than allowablechange. Finally, the last sampled data point was saved as compressed data, as indicated in the step of blocks 123, 124.

The processing element 14 may also be configured or programmed to perform the following functions or operations. The processing element 14 receives a plurality of sampled data points, e.g., S0-Sn−1, and a plurality of sampled times, e.g., t0-tn−1. Each sampled time is associated with a successive sampled data point. The processing element 14 calculates a slope, which may also be considered a first derivative, for each of the sampled data points in succession, wherein the slope is a value of change between the sampled data point and its successive sampled data point. For example, a slope for the first sampled data point, S0, is calculated as the second sampled data point, S1, minus the first sampled data point, S0: (S1-S0), i.e., for sampled data points that were sampled at a constant sampling frequency. A plot of the slope of the exemplary waveform of FIG. 2 versus time is shown in FIG. 9. In general, or for sampled data points that were sampled with a variable sampling frequency, a slope for the first sampled data point, S0, is calculated as a difference between a value of the successive sampled data point, S1, and a value of a current sampled data point, S0, divided by a difference between a value of the sampled time, t1, associated with the successive sampled data point, S1, and a value of the sampled time, t0, associated with the current sampled data point, S0: (S1-S0)/(t1-t0). The processing element 14 tracks, or stores, at least temporarily, the currently-calculated slope and the previouslycalculated slope. For example, when calculating the slope for the second (current) sampled data point, S1, the processing element 14 also has stored and has access to the slope calculated for the first (previous) sampled data point, S0. The processing element 14 may also calculate a change in the slope as a current slope minus a previous slope, or a difference between the two slopes. When the slope changes from the previous-sampled data point to the current-sampled data point—meaning that the difference between the two slopes is not zero—the processing element 14 stores the current-sampled data point in the memory element 12. The processing element 14 may also store the sampled time associated with the current-sampled data point.

The processing element 14 continues the process of calculating a slope for each sampled data point and calculating a difference between the current slope and the previous slope. When the difference is not zero, the processing element 14 stores the current-sampled data point. In other words, wherever the slope changes value, the data point at which the change occurs is stored. From the plot of the slope in FIG. 9, it is seen that the slope changes value at the data points at the following times: t4, t8, t12, and t16. So, the data points at those times are stored in the memory element 12. When the processing element 14 comes to the last sampled data point, it does not perform the calculations, but instead simply stores the last sampled data point and its sampled time. In various embodiments, the processing element 14 may store the first two sampled data points and their associated sampled times automatically.

FIG. 10 depicts a listing of at least a portion of the steps of an exemplary computer-implemented method 200 for compressing sampled data. The steps may be performed in the order shown in FIG. 10, or they may be performed in a different order. Furthermore, some steps may be performed concurrently as opposed to sequentially. In addition, some steps may be optional or may not be performed. The steps may be performed by the processing element 14 of the electronic device 10 via hardware, software, firmware, or combinations thereof. Furthermore, the steps may be implemented as instructions, code, code segments, code statements, a program, an application, an app, a process, a service, a daemon, or the like, and may be stored on a computer-readable storage medium, such as the memory element 12.

Referring to step 201, a plurality of sampled data points and a plurality of sampled times are received. Each sampled data point may be the result of capturing and recording a value of an amplitude of a signal at an instant in time, which is the associated sampled time. Exemplary sampled data points are shown in FIG. 2 and are labeled as S0-S20. Also shown are sampled data times, labeled as t0-t20, wherein t0 is associated with S0, t1 is associated with S1, and so forth. Typically, the sampled data point is a real number representing an actual value of a physical quantity, such as electric voltage or electric current. The sampled time may include a time stamp, such as time of day, an offset time period from when the first sampled data point was captured, or the like Referring to step 202, the first two sampled data points, S0, S1, and the last sampled data point, Sn−1, are stored in the memory element 12. The first two sampled data points and the last sampled data point may be ignored by the operations of the subsequent steps, and thus, may be stored by default. The first two and last sampled times are stored in the memory element 12 as well.

Referring to step 203, a plurality of differences is calculated, wherein each difference is a magnitude of a change between successive adjacent, or consecutive, pairs of sampled data points. Each difference, notated as Dm, wherein m ranges from 0 to the number of sampled data points minus one, may be calculated by subtracting one sampled data point from another sampled data point and determining an absolute value of the result. For example, a first difference, D0, may be calculated as: |S1−S0|. A second difference, D1, may be calculated as: |S2−S1|, and so forth.

Referring to step 204, a plurality of difference changes is calculated, wherein each difference change a magnitude of a change between successive adjacent, or consecutive, pairs of differences. Each difference change, notated as DCx, wherein x ranges from 0 to the number of differences minus one, may be calculated by subtracting one difference from another difference and determining an absolute value of the result. For example, a first difference change, DC0, may be calculated as: |D1−D0|. A second difference change, DC1, may be calculated as: |D2−D1|, and so forth. In addition, each difference change is associated with successive groups of sampled data points, with each group including three sampled data points. The three sampled data points are three consecutive sampled data points that are used to determine two consecutive differences. For example, the first difference, D0, is determined from S1 and S0, while the second difference, D1, is determined from S2 and S1. Thus, the three consecutive data points are S0, S1, and S2. Since the first difference change, DC0, is determined from D1 and D0, the first difference change is associated with the group of sampled data points comprising S0, S1, and S2. Following the same reasoning, the second difference change, DC1, is associated with the group of sampled data points comprising S1, S2, and S3, and so forth.

The group of three consecutive sampled data points associated with each difference change is also the three points that form the first and second segments of the setup and comparison of blocks 114 and 115 of the algorithm 100 discussed above. Furthermore, the difference change is the same value and calculated in a similar way as the magnitude of the change of slope from the first segment to the second segment.

Referring to step 205, each difference change is compared to a threshold. The threshold controls whether the compression of the sampled data is lossless or lossy, and how much compression or loss occurs. For example, the data compression is lossless when the threshold=0. The data compression is lossy when the threshold>0. Generally, the greater the value of the threshold, the more lossy the data compression.

Referring to step 206, for each difference change that is greater than the threshold, a second sampled data point of the group associated with the difference change is stored in the memory element 12. The sampled time associated with the sampled data point is also stored in the memory element 12. As discussed above for step 204, the group of sampled data points associated with each difference change includes three consecutive sampled data points. The second sampled data point is the middle of the three, or the second ordinal point. For example, the first difference change, DC0, includes sampled data points S0, S1, and S2. The second sampled data point is S1. The second difference change, DC1, includes sampled data points comprising S1, S2, and S3. The second sampled data point is S2, and so forth.

The second sampled data point is also the current sampled data point discussed above with reference to blocks 115 and 116 of the algorithm 100, wherein the determination is made as to whether the change in slope between the first and second segments (localdifference) is greater than the threshold (allowablechange). If so, then the current sampled data point is saved. If not, then the current sampled data point is discarded. Like the current sampled data point of the algorithm 100, the second sampled data point of the method 200 is the point under consideration when the determination is made as to whether data compression is performed and the point is discarded or data compression is not performed and the data point is saved. Thus, all of the second sampled data points that are stored in the memory element 12 form the compressed data set.

Another embodiment of the current invention provides an algorithm 300, as shown in the flowchart in FIGS. 11A and 11B, for compressing data that has been sampled from an analog waveform, also known as the "signal". The algorithm 300 may be performed by the processing element 14 of the electronic device 10 via hardware, software, firmware, or combinations thereof. Furthermore, the algorithm 300 may be implemented as instructions, code, code segments, code statements, a program, an application, an app, a process, a service, a daemon, or the like, and may be stored on a computer-readable storage medium, such as the memory element 12.

Referring to FIG. 12, the algorithm 300 may implement a "narrowing beam" method of data compression in which a virtual beam that originates from a starting data point is established. The beam includes a triangular area that exists between an upper bound line and an intersecting lower bound line. The upper bound line is defined by one of the data points selected to be the starting data point, for example, S1 in FIG. 12, and an upper bound point, which is above the next data point, S2 in FIG. 12. The upper bound point has an x value which is the same as the x value of the next data point and a y value which is the y value of the next data point plus an offset, defined as "deltay". The lower bound line is defined by the starting data point and a lower bound point, which is below the next data point. The lower bound point has an x value which is the same as the x value of the next data point and a y value which is the y value of the next data point minus deltay. The upper bound line and the lower bound line form first and second sides of the triangular area of the virtual beam. The offset, deltay, is typically selected by the user and determines an amount of compression of the data, or lossiness of the compression. Generally, the larger the value of deltay, the larger the beam and greater the compression—as a result of more data points being in the beam and getting discarded. Larger values of deltay result in more lossy compression. The smaller the value of deltay, the smaller the beam and the less the compression—as a result of fewer data points being in the beam and getting discarded. Smaller values of deltay result in less lossy compression. A value of zero for deltay results in lossless compression.

Successive data points are evaluated to determine whether they are located within the beam. If a data point is located within the beam, then the data point is discarded and the upper bound line is redefined to include the starting point, as mentioned above, and a new upper delta point, which is the current data point plus deltay. The lower bound line is redefined to include the starting point and a new lower delta point, which is the current data point minus deltay. The upper and lower bound lines are redefined, assuming that the possible new lines actually narrow the beam, as discussed in greater detail below. The redefining (redrawing) of the upper and lower bound lines effectively narrows the beam. For each successive data point that lies within the beam, the beam is successively narrowed and those data points are discarded, as shown in FIG. 13 with upper bound line 1 and lower bound line 1 forming the first beam, upper bound line 2 and lower bound line 2 forming the second beam, and upper bound line 3 and lower bound line 3 forming the third beam (although the beams are not shown). The data points at t2, t3, and t4 are discarded. When a successive data point lies outside the beam, such as the data point at t5, then the previous data point, t4, is retained, and the beam is repositioned to originate at the previous data point and include the upper bound line and the lower bound line. These steps continue with the beam being narrowed for each successive data point that lies within the beam, and the beam being repositioned every time a data point lies outside the beam. Generally, those data points inside the beam are discarded, while those data points outside the beam are retained.

The algorithm 300 is described in more detail as follows. Referring to block 301, an array of retained data point named "results" is defined. In order to compress the data sampled from the waveform, the algorithm 300 only keeps those data points which meet a certain criteria. The remaining data points are discarded. The results array stores the data points which are retained.

Referring to block 302, a stream of sampled data points is received. Each data point includes an x value, which has a time, such as a sample time (t0, t1, t2, etc., as shown in the figures) associated with it, and a y value. Alternatively, the sampled data points may just include the y values, with it being understand that the data points were sampled at a fixed periodic rate. A time value for each point could then be calculated given the properties "delta-T", a period of time between each data point (which is the inverse of the sample rate), and "offset-T", the absolute time for the first data point. Thus, the calculation of the time value for a given point would be t=index*delta-T+offset-T, where index is the sequential number of the sample point.

Referring to block 303, "deltay" is defined as a range of y values outside of which data points may be retained, while inside of which data points may be discarded. deltay is used to define the beam shown in FIG. 12. deltay is typically chosen by the user and has a real number value greater than or equal to 0. Generally, the larger the value of deltay, the larger the beam and greater the compression—as a result of more data points being in the beam and getting discarded. Larger values of deltay result in more lossy compression. The smaller the value of deltay, the smaller the beam and the less the compression—as a result of fewer data points being in the beam and getting discarded. Smaller values of deltay result in less lossy compression. A value of zero for deltay results in lossless compression.

Referring to block 304, a line that marks an upper bound of the beam is defined. The line is defined by two points that are known. The first point is one of the data points. The second point is an upper delta point that has an x value which is the same as the x value of the data point afterward and a y value which is the y value of the data point afterward plus deltay. Knowing these two points, a linear equation which defines the upper bound line can be determined. The linear equation has a form of "y=mx+b", wherein "m" is the slope of the line, and "b" is the y-intercept of the line. The current data point and the next data point provide two points on the line from which the slope and the y-intercept can be calculated. Following the traditional principles of algebra, the slope is determined as: $m=(y_{first}-(y_{second}+deltay))/(x_{first}-x_{second})$. The y-intercept is determined as: $b=y_{first}-m*x_{first}$.

Referring to block 305, a line that marks a lower bound of the beam is defined. The line is defined by two points that are known. The first point is one of the data points. The second point is a lower delta that has an x value which is the same as the x value of the data point afterward and a y value which is the y value of the data point afterward minus deltay. Knowing these two points, a linear equation which defines the lower bound line can be determined. The linear equation has a form of "y=mx+b", wherein "m" is the slope of the line, and "b" is the y-intercept of the line. The current data point and the next data point provide two points on the line from which the slope and the y-intercept can be calculated. Following the traditional principles of algebra, the slope is determined as: $m=(y_{first}-(y_{second}-deltay))/(x_{first}-x_{second})$. The y-intercept is determined as: $b=y_{first}-m*x_{first}$.

Referring to block 306, each data point is evaluated in succession as they are received. Hence, the first time this step is executed, data point S0 at time t0 is the current data point and data point S1 at time t1 is the next data point. The second time this step is executed data point S1 at time t1 is the current data point and data point S2 at time t2 is the next data point, and so forth.

Referring to block 307, it is determined whether the current data point is the last data point. If so, then block 308 is the next step. If not, then block 309 is the next step.

Referring to block 308, the current data point is included in the results array. This occurs when the last data point is evaluated, because the last data point is always included in the results in order to provide an indication of the end of the sampled data.

Referring to block 309, it is determined whether the current data point is the first data point or the second data point. If so, then block 310 is the next step. If not, then block 311 is the next step.

Referring to block 310, the current data point is included in the results array. The first two data points are included in the results in order to be able to derive the original sampling period time, as optional data.

Referring to block 311, it is determined whether the previous data point was retained in the results array. If so, then block 312 is the next step. If not, then block 313 is the next step.

Referring to block 312, the previous data point and the current data point are used to generate the upper bound line and the lower bound line. This step either defines the beam for the first time or redefines the beam thereafter. The previous data point was outside the bounds of the previous beam or was the second data point (which always serves as the starting point of the beam). Each time a data point is outside the beam, the previous data point serves as the starting point of the beam. As covered in the steps of blocks 304 and 305, the upper bound line and the lower bound line are determined. The linear equation for the upper bound line is determined to include the two points of the starting point ($x_{previous}$, $y_{previous}$) and the upper delta point($x_{current}$, $y_{current}$+deltay). The linear equation for the lower bound line is determined to include the two points of the starting point ($x_{previous}$, $y_{previous}$) and the lower delta point ($x_{current}$, $y_{current}$-deltay). Given that the new beam is established, the next step is to evaluate the next data point to determine if it is within the beam as performed in block 306.

Referring to block 313, it is determined whether the current data point is out of bounds of the beam. The determination is made by solving the upper bound and lower bound linear equations for y. The x value of the current data point (which may also be a time value) is plugged into the linear equations for the upper bound line and the lower bound line. The slope and the y-intercept for each equation are already known and plugged in. The solution for y for the upper bound linear equation is an upper bound point at the current data point, while the solution for y for the lower bound linear equation is a lower bound point at the current data point. If the y value of the current data point is less than or equal to the y value of the upper bound point and greater than or equal to the y value of the lower bound point, then the current data point is within the beam. It is not stored in the results array, and the next step is block 316. If the y value of the current data point is greater than the y value of the upper bound point or less than the y value of the lower bound point, then the current data point is outside the beam and the next step is block 314.

Referring to block 314, the previous data point is stored in the results array (because the current data point is outside the beam).

Referring to block 315, the current data point is evaluated again so that the beam can be redefined in the step of block 312. The next step is block 307.

Referring to block 316, the start data point and the current data point are used to generate a temporary upper bound line and a temporary lower bound line. This step narrows the beam, at least temporarily. The linear equation for the temporary upper bound line is determined to include the start point of the current beam and a current upper delta point which is the upper delta point of the current data point. The linear equation for the temporary lower bound line is determined to include the start point of the current beam and a current lower delta point which is the lower delta point of the current data point. Furthermore, since the current data point is within the beam, it is discarded and not stored in the results array.

Referring to block 317, it is determined whether the current lower delta point is greater than a current lower bound point. The current lower bound point is a point on the current lower bound line at the x value of the current data point. Depending on the change in slope of the waveform and/or the magnitude of deltay, it is possible that the temporary lower bound line (or temporary upper bound line, as discussed below) does not narrow the beam. This step determines whether the temporary lower bound line narrows the beam by comparing the current lower delta point to the current lower bound point. The current lower delta point has a y value that is equal to the y value of the current data point minus deltay. The current lower bound point is calculated by solving the linear equation of the current lower bound line for y by plugging in the x value of the current data point. If (the y value of) the current lower delta point is greater than (the y value of) the current lower bound point, then the beam has been narrowed, and the next step is block 318. If the current lower delta point is less than or equal to the current lower bound point, then the beam has not been narrowed, and the next step is block 319.

Referring to block 318, the current lower bound line is updated to the temporary lower bound line. That is, the linear equation defining the current lower bound line is updated to include the start point of the current beam and the current lower delta point. The next step is block 320.

Referring to block 319, the current lower bound line is not updated. The next step is block 320.

Referring to block 320, it is determined whether the current upper delta point is less than a current upper bound point. The current upper bound point is a point on the current upper bound line at the x value of the current data point. As with the lower bound line discussed above, it is possible that the temporary upper bound line does not narrow the beam. The current upper delta point has a y value that is equal to the y value of the current data point plus deltay. The current upper bound point is calculated by solving the linear equation of the current upper bound line for y by plugging in the x value of the current data point. The current upper delta point is compared to the current upper bound point. If (the y value of) the current upper delta point is less than (the y value of) the current upper bound point, then the beam has been narrowed, and the next step is block 321. If the current upper delta point is greater than or equal to the current upper bound point, then the beam has not been narrowed, and the next step is block 322.

Referring to block 321, the current upper bound line is updated to the temporary upper bound line. That is, the linear equation defining the current upper bound line is updated to include the start point of the current beam and the current upper delta point. The next step is block 306 to evaluate the next data point.

Referring to block 322, the current upper bound line is not updated. The next step is block 306 to evaluate the next data point.

Referring to FIGS. 12, 13, and 14, applying the algorithm 300 to a few data points of a sampled waveform is illustrated. In FIG. 12, data points S0-S3 at times t0-t3 are shown. In FIG. 13, the same data points S0-S3 at times t0-t3 are shown along with data points S4 and S5 (although they are not labeled) at times t4 and t5. In applying the algorithm 300 to the waveforms, the first two data points, S0 and S1 are retained and stored by default, and a beam is not yet formed when evaluating S0 and S1. When data point S2 is evaluated, the previous data point, S1, was retained, so the step of block 312 is performed and a beam is defined such that the upper bound line is formed to include the previous data point, S1, and the upper delta point for data point S2. The lower bound line is formed to include the previous data point, S1, and the lower delta point for data point S2, as shown in FIG. 12. In FIG. 13, the upper bound line and the lower bound line determined in this step are shown as upper bound line 1 and lower bound line 1, respectively. The upper delta point for the current data point S2 and the lower delta point for data point S2 are shown as solid black dots aligned with time t2.

The next data point, S3 at time t3, is then evaluated as the current data point. Because data point S3 lies within the beam, the algorithm 300 flows through to block 316, wherein the step of temporarily narrowing the beam is performed. Also, the current data point, S3, is not stored in the results array. The temporary upper bound line and the temporary lower bound line determined in this step are shown in FIG. 13 as upper bound line 2 and lower bound line 2. The upper delta point for the current data point S3 and the lower delta point for data point S3 are shown as solid black dots aligned with time t3. As determined in the steps of blocks 317, 318, 320, and 321, the current lower delta point is greater than the current lower bound point, and the current upper delta point is less than the current upper bound point indicating that the temporary upper bound line and the temporary lower bound line are within the current bounds. So the temporary upper bound line and the temporary lower bound line are now the current upper bound line and the current lower bound line, respectively.

The next data point, S4 at time t4, is then evaluated as the current data point. As with data point S3 discussed above, because data point S4 lies within the beam, the algorithm 300 flows through to block 316, wherein the step of temporarily narrowing the beam is performed, and the current data point, S4, is not stored in the results array. The temporary upper bound line and the temporary lower bound line determined in this step are shown in FIG. 13 as upper bound line 3 and lower bound line 3, respectively. The temporary upper bound line and the temporary lower bound line are within the current bounds as determined in the steps of blocks 317, 318, 320, and 321. So the temporary upper bound line and the temporary lower bound line are now the current upper bound line and the current lower bound line, respectively.

The next data point, S5 at time t5, is then evaluated as the current data point. Because data point S5 lies outside the beam, the algorithm 300 flows through to block 314, wherein the step of storing the previous data point, S4, in the results array is performed. Afterward, the algorithm 300 flows to the step of block 312, because the previous data point, S4, was retained. Although not shown in the figures, a new beam is created which uses the previous data point, S4, and the current upper delta point to form the upper bound line, and the previous data point, S4, and the current lower delta point to form the lower bound line.

An alternative scenario in which one of the temporary bound lines does not narrow the beam is illustrated in FIG. 14. The algorithm 300 is applied in the same manner as described above for data points S0-S3. The difference occurs when data point S4 at time t4 is the current data point. Because data point S4 lies within the beam, the algorithm 300 flows through to block 316, wherein the step of temporarily narrowing the beam is performed. Also, the current data point, S4, is not stored in the results array. The temporary upper bound line and the temporary lower bound line determined in this step are shown in FIG. 14 as upper bound line 3 and lower bound line 3, respectively. The upper delta point for the current data point S4 and the lower delta point for data point S4 are shown as solid black dots aligned with time t4. As determined in the steps of blocks 317 and 318, the current lower delta point is greater than the current lower bound point, so the temporary lower bound line is now the current lower bound line—which is shown as lower bound line 3 in FIG. 14. But, as determined in the steps of blocks 320 and 322, the current upper delta point is not less than the current upper bound point—indicating that the temporary upper bound line did not narrow the beam. So the temporary upper bound line is rejected and the current upper bound line remains—which is shown as upper bound line 2 in FIG. 14.

Referring to FIGS. 15-19, the application of the algorithm 300 to the waveform of FIG. 2 is illustrated. As shown in FIG. 15, the first beam is created at data point 51 and includes data point S2 plus and minus deltay. Data points S0 and 51 are retained in the results array by default. The beam is successively narrowed at data points S3 and S4. Data points S2 and S3 are not retained. Data point S5 is outside of the beam, resulting in the beam needing to be redefined and data point S4 being retained in the results array.

In FIG. 16, a second beam is created at data point S4 and includes data point S5 plus and minus deltay. The beam is successively narrowed at data points S6, S7, and S8. Data points S5, S6, and S7 are not retained. Data point S9 is outside of the beam, resulting in the beam needing to be redefined and data point S8 being retained in the results array.

In FIG. 17, a third beam is created at data point S8 and includes data point S9 plus and minus deltay. The beam is successively narrowed at data points S10 and S11. Data points S9, S10, and S11 are not retained. Data point S13 is outside of the beam, resulting in the beam needing to be redefined and data point S12 being retained in the results array.

In FIG. 18, a fourth beam is created at data point S12 and includes data point S13 plus and minus deltay. The beam is successively narrowed at data points S14, S15, and S16. Data points S13, S14, and S15 are not retained. Data point S17 is outside of the beam, resulting in the beam needing to be redefined and data point S16 being retained in the results array.

In FIG. 19, a fifth beam is created at data point S16 and includes data point S17 plus and minus deltay. The beam is successively narrowed at data points S18 and S19. Data points S17, S18, and S19 are not retained. Data point S20 is the last point of the waveform and is retained in the results array by default. The results of applying algorithm 300 to the waveform of FIG. 2 are the same as applying algorithm 100 to the waveform of FIG. 2. And, the contents of the results array are the same as the contents of the combination of outputamplitude and outputtime, as shown in FIG. 7.

Yet another embodiment of the current invention provides a method 400 for compressing data that has been sampled from an analog waveform. At least a portion of the steps of the method 400 are shown in the flow diagram in FIGS. 20A and 20B. The steps may be performed in the order shown in FIGS. 20A and 20B, or they may be performed in a different order. Furthermore, some steps may be performed concurrently as opposed to sequentially. In addition, some steps may be optional or may not be performed. The steps may be performed by the processing element 14 of the computing device 10 via hardware, software, firmware, or combinations thereof. Furthermore, the steps may be implemented as instructions, code, code segments, code statements, a program, an application, an app, a process, a service, a daemon, or the like, and may be stored on a computer-readable storage medium, such as the memory element 12.

Referring to step 401, a stream of sampled data points is received. Each data point includes an x value, which has a time, such as a sample time (t0, t1, t2, etc., as shown in the figures) associated with it, and a y value.

Referring to step 402, an array of retained data point named "results" is defined. In order to compress the data sampled from the waveform, the algorithm 300 only keeps those data points which meet a certain criteria. The remaining data points are discarded. The results array stores the data points which are retained.

Referring to step 403, "deltay" is defined as a range of y values outside of which data points may be retained, while inside of which data points may be discarded. deltay is used to define an upper bound line and a lower bound line. deltay is typically chosen by the user and has a real number value greater than or equal to 0. Generally, the larger the value of deltay, the farther apart the upper and lower bound lines and the greater the compression—as a result of more data points being within the bound lines and getting discarded. Larger values of deltay result in more lossy compression. The smaller the value of deltay, the closer together the upper and lower bound lines and the less the compression—as a result of fewer data points being within the bound lines and getting discarded. Smaller values of deltay result in less lossy compression. A value of zero for deltay results in lossless compression.

Referring to step 404, a line that marks an upper bound of the beam is defined. The line is defined by two points that are known. The first point is one of the data points. The second point is an upper delta point that has an x value which is the same as the x value of the data point afterward and a y value which is the y value of the data point afterward plus deltay. Knowing these two points, a linear equation which defines the upper bound line can be determined. The linear equation has a form of "y=mx+b", wherein "m" is the slope of the line, and "b" is the y-intercept of the line. The current data point and the next data point provide two points on the line from which the slope and the y-intercept can be calculated. Following the traditional principles of algebra, the slope is determined as: $m=(y_{first}-(y_{second}+\text{deltay}))/(x_{first}-x_{second})$. The y-intercept is determined as: $b=y_{first}-m*x_{first}$. The first time that the upper bound line is determined, the starting point is the second data point and the upper delta point is the third data point plus deltay.

Referring to step 405, a line that marks a lower bound of the beam is defined. The line is defined by two points that are known. The first point is one of the data points. The second point is a lower delta that has an x value which is the same as the x value of the data point afterward and a y value which is the y value of the data point afterward minus deltay. Knowing these two points, a linear equation which defines the lower bound line can be determined. The linear equation has a form of "y=mx+b", wherein "m" is the slope of the line, and "b" is the y-intercept of the line. The current data point and the next data point provide two points on the line from which the slope and the y-intercept can be calculated. Following the traditional principles of algebra, the slope is determined as: $m=(y_{first}-(y_{second}-\text{deltay}))/(x_{first}-x_{second})$. The y-intercept is determined as: $b=y_{first}-m*x_{first}$. The first time that the lower bound line is determined, the starting point is the second data point and the upper delta point is the third data point minus deltay.

Referring to step 406, for each successive data point that is located between the upper and lower bound lines, determine a new upper bound line which includes the starting data point and the upper delta point if the upper delta point is less than an upper bound point. Each data point is evaluated in succession as they are received. The first time this step is executed, data point S2 at time t2 (the third data point) is the current data point. The second time this step is executed data point S3 at time t3 is the current data point, and so forth.

The calculation for whether a data point is located between the upper and lower bound lines involves solving the upper bound and lower bound linear equations for y. The x value of the current data point (which may also be a time value) is plugged into the linear equations for the upper bound line and the lower bound line. The slope and the y-intercept for each equation are already known and plugged in. The solution for y for the upper bound linear equation is the upper bound point at the current data point. If the y value of the current data point is less than or equal to the y value of the upper bound point and greater than or equal to the y value of the lower bound point, then the current data point is located between the upper and lower bound lines.

The linear equation for the new upper bound line is determined to include the start point of the current beam and a current upper delta point which is the upper delta point of the current data point. If (the y value of) the current upper delta point is less than (the y value of) the current upper bound point, then the new upper bound line reduces the area between the upper and lower bound lines. So the new upper bound line becomes the current upper bound line.

Referring to step 407, for each successive data point that is located between the upper and lower bound lines, determine a new lower bound line which includes the starting data point and the lower delta point if the lower delta point is greater than a lower bound point. The process for determining whether a data point is located between the upper and lower bound lines is discussed in step 406. If the current data point is determined to be within the upper and lower bound lines, then the linear equation for the new lower bound line is determined to include the start point of the current beam and a current lower delta point which is the lower delta point of the current data point. If (the y value of)

the current lower delta point is less than (the y value of) the current lower bound point, then the new lower bound line reduces the area between the upper and lower bound lines. So the new lower bound line becomes the current lower bound line.

Referring to step 408, for each successive data point that is located between the upper and lower bound lines, do not retain the data point in the results array.

Referring to step 409, for a first successive data point that is not located between the upper and lower bound lines, retain the previous data point in the results array. When a data point is located outside of the upper and lower bound lines, it is an indication that the waveform is changing value significantly enough to save the data.

Referring to step 410, for the first successive data point that is not located between the upper and lower bound lines, determine a new upper bound line which includes the previous data point and the upper delta point. When a data point is located outside of the upper and lower bound lines, then the upper and lower bound lines are re-established.

Referring to step 411, for the first successive data point that is not located between the upper and lower bound lines, determine a new lower bound line which includes the previous data point and the upper delta point. When a data point is located outside of the upper and lower bound lines, then the upper and lower bound lines are re-established.

After the upper and lower bound lines are re-established, the next data point is analyzed at step 406 and the process executed in steps 406-411 repeats.

Additional Considerations

Throughout this specification, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the current invention can include a variety of combinations and/or integrations of the embodiments described herein.

Although the present application sets forth a detailed description of numerous different embodiments, it should be understood that the legal scope of the description is defined by the words of the claims set forth at the end of this patent and equivalents. The detailed description is to be construed as exemplary only and does not describe every possible embodiment since describing every possible embodiment would be impractical. Numerous alternative embodiments may be implemented, using either current technology or technology developed after the filing date of this patent, which would still fall within the scope of the claims.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of routines, subroutines, applications, or instructions. These may constitute either software (e.g., code embodied on a machine-readable medium or in a transmission signal) or hardware. In hardware, the routines, etc., are tangible units capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as computer hardware that operates to perform certain operations as described herein.

In various embodiments, computer hardware, such as a processing element, may be implemented as special purpose or as general purpose. For example, the processing element may comprise dedicated circuitry or logic that is permanently configured, such as an application-specific integrated circuit (ASIC), or indefinitely configured, such as an FPGA, to perform certain operations. The processing element may also comprise programmable logic or circuitry (e.g., as encompassed within a general-purpose processor or other programmable processor) that is temporarily configured by software to perform certain operations. It will be appreciated that the decision to implement the processing element as special purpose, in dedicated and permanently configured circuitry, or as general purpose (e.g., configured by software) may be driven by cost and time considerations.

Accordingly, the term "processing element" or equivalents should be understood to encompass a tangible entity, be that an entity that is physically constructed, permanently configured (e.g., hardwired), or temporarily configured (e.g., programmed) to operate in a certain manner or to perform certain operations described herein. Considering embodiments in which the processing element is temporarily configured (e.g., programmed), each of the processing elements need not be configured or instantiated at any one instance in time. For example, where the processing element comprises a general-purpose processor configured using software, the general-purpose processor may be configured as respective different processing elements at different times. Software may accordingly configure the processing element to constitute a particular hardware configuration at one instance of time and to constitute a different hardware configuration at a different instance of time.

Computer hardware components, such as communication elements, memory elements, processing elements, and the like, may provide information to, and receive information from, other computer hardware components. Accordingly, the described computer hardware components may be regarded as being communicatively coupled. Where multiple of such computer hardware components exist contemporaneously, communications may be achieved through signal transmission (e.g., over appropriate circuits and buses) that connect the computer hardware components. In embodiments in which multiple computer hardware components are configured or instantiated at different times, communications between such computer hardware components may be achieved, for example, through the storage and retrieval of information in memory structures to which the multiple computer hardware components have access. For example, one computer hardware component may perform an operation and store the output of that operation in a memory device to which it is communicatively coupled. A further computer hardware component may then, at a later time, access the memory device to retrieve and process the stored output. Computer hardware components may also initiate communications with input or output devices, and may operate on a resource (e.g., a collection of information).

The various operations of example methods described herein may be performed, at least partially, by one or more processing elements that are temporarily configured (e.g., by software) or permanently configured to perform the relevant operations. Whether temporarily or permanently configured, such processing elements may constitute processing element-implemented modules that operate to perform one or more operations or functions. The modules referred to herein may, in some example embodiments, comprise processing element-implemented modules.

Similarly, the methods or routines described herein may be at least partially processing element-implemented. For example, at least some of the operations of a method may be performed by one or more processing elements or processing element-implemented hardware modules. The performance of certain of the operations may be distributed among the one or more processing elements, not only residing within a single machine, but deployed across a number of machines. In some example embodiments, the processing elements may be located in a single location (e.g., within a home environment, an office environment or as a server farm), while in other embodiments the processing elements may be distributed across a number of locations.

Unless specifically stated otherwise, discussions herein using words such as "processing," "computing," "calculating," "determining," "presenting," "displaying," or the like may refer to actions or processes of a machine (e.g., a computer with a processing element and other computer hardware components) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus.

The patent claims at the end of this patent application are not intended to be construed under 35 U.S.C. § 112(f) unless traditional means-plus-function language is expressly recited, such as "means for" or "step for" language being explicitly recited in the claim(s).

Although the technology has been described with reference to the embodiments illustrated in the attached drawing figures, it is noted that equivalents may be employed and substitutions made herein without departing from the scope of the technology as recited in the claims.

Having thus described various embodiments of the technology, what is claimed as new and desired to be protected by Letters Patent includes the following:

The invention claimed is:

1. An electronic device for compressing data that has been sampled from an analog waveform, the electronic device comprising:

a memory element configured to store sampled data points and sampled times and a results array to include a portion of the data points; and a processing element in electronic communication with the memory element, the processing element configured to receive a stream of sampled data points, each data point including at least a y value, receive a value for deltay to determine an amount of data compression, determine an upper bound line which includes a variable starting data point and an upper delta point, the variable starting data point being any data point in the stream of data points, determine a lower bound line which includes the variable starting data point and a lower delta point, for each successive current data point that is located between the upper and lower bound lines, perform the following steps:

determine a successive upper bound line which includes the variable starting data point and a current upper delta point if the current upper delta point is less than a current upper bound point, determine a successive lower bound line which includes the variable starting data point and a current lower delta point if the current lower delta point is greater than a current lower bound point, and do not retain the data point in the results array, and for a first successive current data point that is not located between the upper and lower bound lines, perform the following steps:

retain the previous data point in the results array, determine a new upper bound line which includes the variable starting data point and the current upper delta point, the variable starting data point being updated to the previous data point, and determine a new lower bound line which includes the updated variable starting data point and the current lower delta point.

2. The electronic device of claim 1, wherein the upper delta point is defined by a third data point in the stream of data points that is offset in the positive y direction by deltay.

3. The electronic device of claim 1, wherein the lower delta point is defined by a third data point in the stream of data points that is offset in the negative y direction by deltay.

4. The electronic device of claim 1, wherein the current upper delta point is defined by the current data point that is offset in the positive y direction by deltay.

5. The electronic device of claim 1, wherein the current delta point is defined by the current data point that is offset in the negative y direction by deltay.

6. The electronic device of claim 1, wherein the current upper bound point is determined by solving a first linear equation defining the upper bound line for a first y value given a first x value equal to the x value of the current data point.

7. The electronic device of claim 1, wherein the current lower bound point is determined by solving a second linear equation defining the lower bound line for a second y value given a second x value equal to the x value of the current data point.

8. The electronic device of claim 1, wherein determining whether the current data point is between the upper and lower bound lines includes solving a first linear equation defining the upper bound line for a first y value given a first x value equal to the x value of the current data point, solving a second linear equation defining the lower bound line for a second y value given a second x value equal to the x value of the current data point, and determining that the current data point is between the upper and lower bound lines if the y value of the current data point is less than the first y value and greater than the second y value.

9. An electronic device for compressing data that has been sampled from an analog waveform, the electronic device comprising:

a memory element configured to store sampled data points and sampled times and a results array to include a portion of the data points; and a processing element in electronic communication with the memory element, the processing element configured to receive a stream of sampled data points, each data point including at least and a y value, receive a value for deltay to determine an amount of data compression, determine an upper bound line which includes a variable starting data point and an upper delta point, the variable starting data point being a second data point in the stream of data points and the upper delta point being a third data point in the stream of data points that is offset in the positive y direction by deltay, determine a lower bound line which includes the variable starting data point and a lower delta point, the lower delta point being a third data point in the stream of data points that is offset in the negative y direction by deltay, for each successive current data point that is located between the upper and lower bound lines, perform the following steps:

determine a successive upper bound line which includes the variable starting data point and a current upper delta point if the current upper delta point is less than a current upper bound point, the current upper delta point being the current data point that is offset in the positive y direction by deltay, determine a successive lower bound line which includes the variable starting data point and a current lower delta point if the current lower delta point is greater than a current lower bound point, the current lower delta point being the current data point that is offset in the negative y direction by deltay, and exclude the data point in the results array, and for a first successive current data point that is not located between the upper and lower bound lines, perform the following steps:

retain the previous data point in the results array, determine a new upper bound line which includes the variable starting data point and the current upper delta point, the variable starting data point being updated to the previous data point, and determine a new lower bound line which includes the updated variable starting data point and the current lower delta point.

10. The electronic device of claim 9, wherein the current upper bound point is determined by solving a first linear equation defining the upper bound line for a first y value given a first x value equal to the x value of the current data point.

11. The electronic device of claim 9, wherein the current lower bound point is determined by solving a second linear equation defining the lower bound line for a second y value given a second x value equal to the x value of the current data point.

12. The electronic device of claim 9, wherein determining whether the current data point is between the upper and lower bound lines includes solving a first linear equation defining the upper bound line for a first y value given a first x value equal to the x value of the current data point, solving a second linear equation defining the lower bound line for a second y value given a second x value equal to the x value of the current data point, and determining that the current data point is between the upper and lower bound lines if the y value of the current data point is less than the first y value and greater than the second y value.

13. A computer-implemented method for compressing data that has been sampled from an analog waveform, the method comprising:

receiving a stream of sampled data points, each data point including at least and a y value;

defining a results array to include a portion of the data points;

receiving a value for deltay to determine an amount of data compression, determining an upper bound line which includes a variable starting data point and an upper delta point, the variable starting data point being any data point in the stream of data points, determining a lower bound line which includes the variable starting data point and a lower delta point, for each successive current data point that is located between the upper and lower bound lines, performing the following steps:

determining a successive upper bound line which includes the variable starting data point and a current upper delta point if the current upper delta point is less than a current upper bound point, determining a successive lower bound line which includes the variable starting data point and a current lower delta point if the current lower delta point is greater than a current lower bound point, and excluding the data point from the results array, and for a first successive current data point that is not located between the upper and lower bound lines, performing the following steps:

retaining the previous data point in the results array, determining a new upper bound line which includes the variable starting data point and the current upper delta point, the variable starting data point being updated to the previous data point, and determining a new lower bound line which includes the updated variable starting data point and the current lower delta point.

14. The computer-implemented method of claim 13, wherein the upper delta point is defined by a third data point in the stream of data points that is offset in the positive y direction by deltay.

15. The computer-implemented method of claim 13, wherein the lower delta point is defined by a third data point in the stream of data points that is offset in the negative y direction by deltay.

16. The computer-implemented method of claim 13, wherein the current upper delta point is defined by the current data point that is offset in the positive y direction by deltay.

17. The computer-implemented method of claim 13, wherein the current delta point is defined by the current data point that is offset in the negative y direction by deltay.

18. The computer-implemented method of claim 13, wherein the current upper bound point is determined by solving a first linear equation defining the upper bound line for a first y value given a first x value equal to the x value of the current data point.

19. The computer-implemented method of claim 13, wherein the current lower bound point is determined by solving a second linear equation defining the lower bound line for a second y value given a second x value equal to the x value of the current data point.

20. The computer-implemented method of claim 13, wherein determining whether the current data point is between the upper and lower bound lines includes
- solving a first linear equation defining the upper bound line for a first y value given a first x value equal to the x value of the current data point,
- solving a second linear equation defining the lower bound line for a second y value given a second x value equal to the x value of the current data point, and
- determining that the current data point is between the upper and lower bound lines if the y value of the current data point is less than the first y value and greater than the second y value.

* * * * *